(12) United States Patent
Shimatani et al.

(10) Patent No.: US 11,682,741 B2
(45) Date of Patent: Jun. 20, 2023

(54) ELECTROMAGNETIC WAVE DETECTOR

(71) Applicant: Mitsubishi Electric Corporation, Tokyo (JP)

(72) Inventors: Masaaki Shimatani, Tokyo (JP); Shimpei Ogawa, Tokyo (JP); Shoichiro Fukushima, Tokyo (JP); Satoshi Okuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/608,155

(22) PCT Filed: Mar. 26, 2020

(86) PCT No.: PCT/JP2020/013663
§ 371 (c)(1),
(2) Date: Nov. 2, 2021

(87) PCT Pub. No.: WO2021/002070
PCT Pub. Date: Jan. 7, 2021

(65) Prior Publication Data
US 2022/0223747 A1   Jul. 14, 2022

(30) Foreign Application Priority Data

Jul. 4, 2019 (JP) ............................. JP2019-125501

(51) Int. Cl.
*H01L 31/028* (2006.01)
*H01L 27/144* (2006.01)
(Continued)

(52) U.S. Cl.
CPC ........ *H01L 31/028* (2013.01); *H01L 27/1446* (2013.01); *H01L 31/109* (2013.01); *H01L 31/112* (2013.01)

(58) Field of Classification Search
CPC ... H01L 31/028; H01L 31/109; H01L 31/112; H01L 31/02161; H01L 31/022408;
(Continued)

(56) References Cited

U.S. PATENT DOCUMENTS

2015/0243826 A1   8/2015 An et al.

FOREIGN PATENT DOCUMENTS

| CN | 106784122 A | 5/2017 |
| CN | 107994095 A | 5/2018 |
| CN | 106784122 B | * 6/2018 |

OTHER PUBLICATIONS

International Search Report and Written Opinion dated Jun. 23, 2020, received for PCT Application PCT/JP2020/013663, Filed on Mar. 26, 2020, 9 pages including English Translation.

* cited by examiner

*Primary Examiner* — Sitaramarao S Yechuri
(74) *Attorney, Agent, or Firm* — Xsensus LLP

(57) ABSTRACT

An electromagnetic wave detector includes a light-receiving element, an insulating film, a two-dimensional material layer, a first electrode part, and a second electrode part. The light-receiving element includes a first semiconductor portion of a first conductivity type and a second semiconductor portion. The second semiconductor portion is joined to the first semiconductor portion. The second semiconductor portion is of a second conductivity type. The insulating film is disposed on the light-receiving element. The insulating film has an opening portion. The two-dimensional material layer is electrically connected to the first semiconductor portion in the opening portion. The two-dimensional material layer extends from on the opening portion onto the insulating film. The first electrode part is disposed on the insulating film. The first electrode part is electrically connected to the
(Continued)

two-dimensional material layer. The second electrode part is electrically connected to the second semiconductor portion.

23 Claims, 23 Drawing Sheets

(51) Int. Cl.
*H01L 31/109* (2006.01)
*H01L 31/112* (2006.01)

(58) Field of Classification Search
CPC ........... H01L 31/035272; H01L 31/103; H01L 31/11; H01L 27/1446
See application file for complete search history.

ELECTROMAGNETIC WAVE DETECTOR

CROSS-REFERENCE TO RELATED APPLICATIONS

The present application is based on PCT filing PCT/JP2020/013663, filed Mar. 26, 2020, which claims priority to JP 2019-125501, filed Jul. 4, 2019, the entire contents of each are incorporated herein by reference.

TECHNICAL FIELD

The present disclosure relates to an electromagnetic wave detector.

BACKGROUND ART

Conventionally, graphene with extremely high mobility which is an example of two-dimensional material layers has been known as a material of electromagnetic wave detection layers for use in next-generation electromagnetic wave detectors. The absorption of graphene is as low as 2.3%. Techniques for increasing the sensitivity of electromagnetic wave detectors using graphene have been proposed. For example, United States Patent Application Publication 2015/0243826A1 proposes a detector having the following structure. Specifically, in United States Patent Application Publication 2015/0243826A1, two or more dielectric layers are provided on an n-type semiconductor layer. A graphene layer is formed on two dielectric layers and a surface portion of the n-type semiconductor layer positioned between the two dielectric layers. The source and drain electrodes connected to both ends of the graphene layer are disposed on the dielectric layers. The gate electrode is connected to the n-type semiconductor layer.

In the above detector, a voltage is applied to the graphene layer as a channel through the source and drain electrodes. As a result, the optical carriers produced in the n-type semiconductor layer are amplified to increase the sensitivity of the detector. When a voltage is applied between the gate electrode and the source electrode or the drain electrode, OFF operation is enabled with the Schottky connection between the graphene and the n-type semiconductor layer.

CITATION LIST

Patent Literature

PTL 1: United States Patent Application Publication 2015/0243826A1

SUMMARY OF INVENTION

Technical Problem

Unfortunately, in the detector described above, the OFF operation of the detector is difficult because transistor operation is performed in high sensitivity operation in which a source-drain voltage is applied to the graphene. Moreover, the sensitivity of the detector is dependent on the quantum efficiency of the semiconductor layer in Schottky operation in which a voltage is applied between the gate electrode and the source electrode or the drain electrode. The optical carriers therefore fail to be sufficiently amplified and it is difficult to increase the sensitivity of the detector. In this way, higher sensitivity and OFF operation are incompatible in a conventional detector using a two-dimensional material layer such as graphene.

The present disclosure is made in order to solve the problem as described above, and an object of the present disclosure is to provide an electromagnetic wave detector including a two-dimensional material layer that has high detection sensitivity and is capable of OFF operation.

Solution to Problem

An electromagnetic wave detector according to the present disclosure includes a light-receiving element, an insulating film, a two-dimensional material layer, a first electrode part, and a second electrode part. The light-receiving element includes a first semiconductor portion of a first conductivity type and a second semiconductor portion. The second semiconductor portion is joined to the first semiconductor portion. The second semiconductor portion is of a second conductivity type. The insulating film is disposed on the light-receiving element. The insulating film has an opening portion. The two-dimensional material layer is electrically connected to the first semiconductor portion in the opening portion. The two-dimensional material layer extends from on the opening portion onto the insulating film. The first electrode part is disposed on the insulating film. The first electrode part is electrically connected to the two-dimensional material layer. The second electrode part is electrically connected to the second semiconductor portion.

Advantageous Effects of Invention

According to the foregoing, the electromagnetic wave detector with high detection sensitivity and capable of OFF operation can be provided because the two-dimensional material layer extends from on the insulating film positioned on the light-receiving element and having an opening portion to the inside of the opening portion.

DESCRIPTION OF EMBODIMENTS

Figure 1:
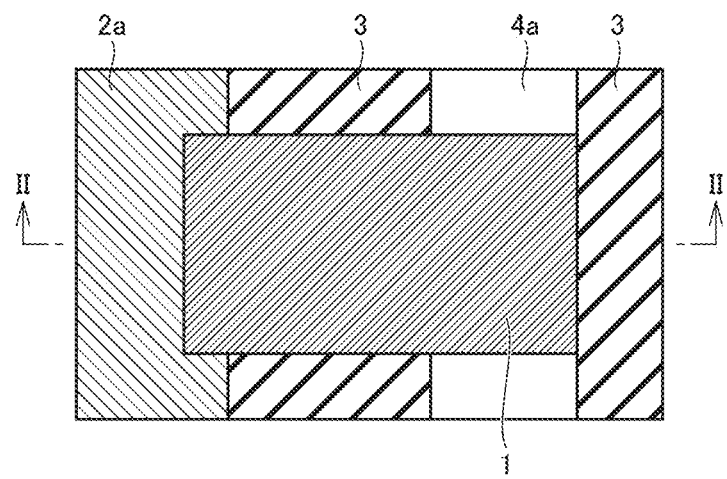
FIG. 1 is a plan view of an electromagnetic wave detector according to a first embodiment.

Embodiments of the present disclosure will be described below. The same configuration is denoted by the same reference numeral and a description thereof will not be repeated.

In the embodiments described below, the drawings are schematic and conceptually illustrate functions or structures. The present disclosure is not intended to be limited by the embodiments described below. The basic configuration of the electromagnetic wave detector is common in all the embodiments, unless otherwise specified. Those denoted by the same reference signs refer to the same or equivalent as described above. This applies in all the text in the description.

In the embodiments described below, a configuration of an electromagnetic wave detector for detecting visible light or infrared light will be described. However, the present disclosure is not limited thereto. The embodiments described below are useful as a detector for detecting visible light or infrared light as well as electromagnetic waves such as X rays, ultraviolet light, near-infrared light, terahertz (THz) waves, or microwaves. In the embodiments in the present disclosure, these lights and radio waves are collectively referred to as electromagnetic waves.

In the embodiments in the present disclosure, the term "p-type graphene" or "n-type graphene" is sometimes used. In the following embodiments, graphene with more holes than those of intrinsic graphene is referred to as p-type graphene and graphene with more electrons is referred to as n-type graphene.

In the embodiments of the present disclosure, the term "n type" or "p type" is sometimes used for a material of a member in contact with graphene which is an example of two-dimensional material layers. Here, for example, the n-type material refers to an electron-donating material and the p-type material refers to an electron-withdrawing material. Those in which there is uneven distribution of charges in the whole molecule and electrons are dominant may be referred to as n type, and those in which holes are dominant may be referred to as p type. One of an organic substance and an inorganic substance or a mixture thereof can be used as those materials.

Plasmon resonance phenomena such as surface plasmon resonance that is the interaction between a metal surface and light, phenomena called pseudo surface plasmon resonance in a sense of resonance related to a metal surface in a band other than the visible light band and the near-infrared light band, or phenomena called metamaterial or plasmonic metamaterial in a sense that particular wavelengths are manipulated by a structure having dimensions smaller than the wavelengths are not distinguished from each other by designation and considered to be equivalent in terms of the effect by the phenomena. Here, these resonances are referred to as surface plasmon resonance, plasmon resonance, or simply referred to as resonance.

In the embodiments described below, graphene is taken as an example of the material of two-dimensional material layers but the material forming two-dimensional material layers is not limited to graphene. For example, materials such as transition metal dichalcogenide (TMD), black phosphorus, silicene (a two-dimensional honeycomb structure of silicon atoms), and germanene (a two-dimensional honeycomb structure of germanium atoms) can be employed as a material of two-dimensional material layers. Examples of the transition metal dichalcogenide include transition metal dichalcogenide such as $MoS_2$, $WS_2$, and $WSe_2$.

These materials have a structure similar to that of graphene and in which atoms can be arranged in a single layer in a two-dimensional plane. Therefore, when these materials are applied to a two-dimensional material layer, an operation effect similar to the one achieved when graphene is applied to a two-dimensional material layer can be achieved.

First Embodiment

<Configuration of Electromagnetic Wave Detector>

Figure 2:
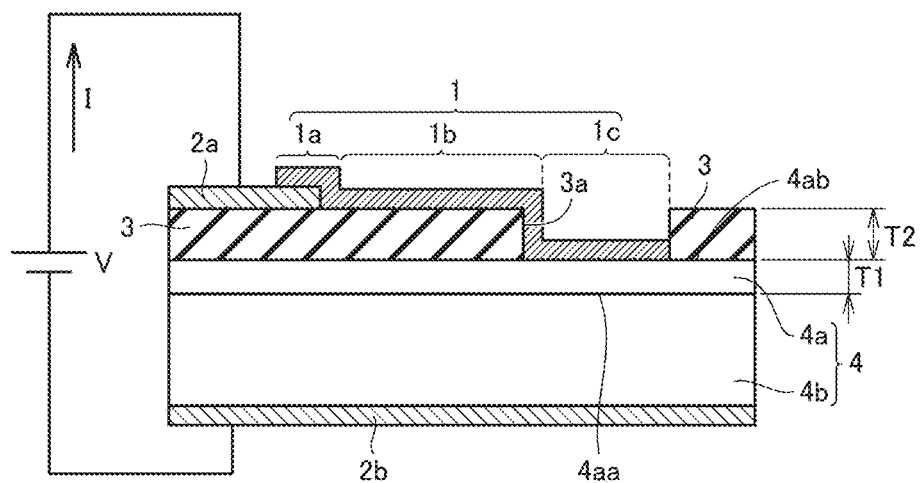
FIG. 2 is a cross-sectional view along line II-II in FIG. 1.

FIG. 1 is a plan view of an electromagnetic wave detector according to a first embodiment. FIG. 2 is a cross-sectional view along line II-II in FIG. 1. The electromagnetic wave detector shown in FIG. 1 and FIG. 2 mainly includes a light-receiving element 4, an insulating film 3, a two-dimensional material layer 1, a first electrode part 2a, and a second electrode part 2b. Light-receiving element 4 includes a first semiconductor portion 4a and a second semiconductor portion 4b. Light-receiving element 4 is an element that has sensitivity to wavelengths of electromagnetic waves to be detected by the electromagnetic wave detector and, when irradiated with an electromagnetic wave having a wavelength to be detected, converts light to electricity in a junction between first semiconductor portion 4a and second semiconductor portion 4b. First semiconductor portion 4a has a first conductivity type. Second semiconductor portion 4b is joined to first semiconductor portion 4a at a junction portion 4aa. Second semiconductor portion 4b has a second conductivity type different from the first conductivity type. First semiconductor portion 4a is doped with, for example, a carrier of the first conductivity type. Second semiconductor portion 4b is doped with, for example, a carrier of the second conductivity type. Second electrode part 2b is connected to a back surface positioned on the side opposite to junction portion 4aa in second semiconductor portion 4b.

As shown in FIG. 2, a power supply circuit for applying a bias voltage V is electrically connected to second electrode part 2b formed on the back surface of second semiconductor portion 4b and first electrode part 2a formed on insulating film 3. Specifically, the power supply circuit connected to first electrode part 2a and second electrode part 2b serving as electrodes is a circuit for applying a voltage V to two-dimensional material layer 1. A not-shown ammeter for detecting current I in two-dimensional material layer 1 between first electrode part 2a and second electrode part 2b is connected to the power supply circuit connected to the electrodes.

Insulating film 3 is disposed on light-receiving element 4. Specifically, insulating film 3 is formed on a front surface 4ab positioned on the side opposite to junction portion 4aa in first semiconductor portion 4a. Opening portion 3a is formed in insulating film 3. Two-dimensional material layer 1 extends from the inside of opening portion 3a onto insulating film 3. First electrode part 2a is disposed on insulating film 3. First electrode part 2a is disposed at a position spaced apart from opening portion 3a. A region 1a at an end portion of two-dimensional material layer 1 is connected on a part of the front surface of first electrode part 2a. Inside opening portion 3a, region 1a at an end portion of two-dimensional material layer 1 is directly connected to front surface 4ab of first semiconductor portion 4a of light-receiving element 4. A region 1b disposed on the front surface of insulating film 3 and positioned between regions 1a at both ends of two-dimensional material layer 1 is a portion opposed to light-receiving element 4 with insulating film 3 interposed.

Second semiconductor portion 4b is made of, for example, a semiconductor material such as silicon (Si). Specifically, a silicon substrate doped with an impurity is used as second semiconductor portion 4b. First semiconductor portion 4a is made of a semiconductor material doped with a carrier opposite to that of second semiconductor portion 4b. Specifically, first semiconductor portion 4a can be fabricated by injecting an impurity into a silicon substrate or the like. Alternatively, first semiconductor portion 4a may be formed by depositing a semiconductor material on a surface of second semiconductor portion 4b.

Here, junction portion 4aa that is an interface between first semiconductor portion 4a and second semiconductor portion 4b has a pn junction. First semiconductor portion 4a and second semiconductor portion 4b having this junction portion 4aa serve as light-receiving element 4 that generates photocurrent when irradiated with electromagnetic waves such as light. First semiconductor portion 4a is not necessarily provided on the entire upper surface of second semiconductor portion 4b. For example, it is only necessary that two-dimensional material layer 1 is not in contact with second semiconductor portion 4b and electric field change occurs in two-dimensional material layer 1 through insulating film 3.

Here, light-receiving element 4 formed with first semiconductor portion 4a and second semiconductor portion 4b is described as a common pn junction photodiode, by way of example. However, a pin photodiode, a Schottky photodiode, or an avalanche photodiode may be used as light-receiving element 4. A phototransistor may be used as light-receiving element 4.

A silicon substrate has been described above as a semiconductor material forming light-receiving element 4. However, other materials may be used as a material forming light-receiving element 4. For example, a substrate containing germanium (Ge), a compound semiconductor such as III-V group or II-V group semiconductor, mercury cadmium telluride (HgCdTe), indium antimonide (InSb), lead selenide (PbSe), lead sulfide (PbS), cadmium sulfide (CdS), gallium nitride (GaN), silicon carbide (SiC), gallium phosphide (GaP), indium gallium arsenide (InGaAs), indium arsenide (InAs), or quantum wells or quantum dots, a single material such as Type II superlattice, or a material of a combination thereof may be used as a material forming light-receiving element 4.

The detection wavelength of the electromagnetic wave detector in the present embodiment is determined by a material forming light-receiving element 4. For example, when gallium phosphide is used as the material, the range of detection wavelengths is 0.1 μm to 0.6 μm. When silicon is used as the material, the range of detection wavelengths is 0.2 µm to 1.1 µm. When germanium is used as the material, the range of detection wavelengths is 0.8 µm to 1.8 µm. When indium gallium arsenide is used as the material, the range of detection wavelengths is 0.7 µm to 2.55 µm. When indium arsenide is used as the material, the range of detection wavelengths is 1 µm to 3.1 µm. When indium antimonide is used as the material, the range of detection wavelengths is 1 µm to 5.5 µm. When mercury cadmium telluride is used as the material, the range of detection wavelengths is 2 µm to 16 µm. These materials may be used in combination as the material forming light-receiving element 4. For example, materials having different detection wavelengths may be used for first semiconductor portion 4a and second semiconductor portion 4b that constitute light-receiving element 4. In this case, multiple wavelengths can be detected in the electromagnetic wave detector.

In the electromagnetic wave detector according to the present embodiment, it is preferable that first semiconductor portion 4a and second semiconductor portion 4b are doped with an impurity such that the electrical resistivity of first semiconductor portion 4a and second semiconductor portion 4b is 100 Ω·cm or lower. Heavy doping of first semiconductor portion 4a and second semiconductor portion 4b increases the moving speed (read speed) of photocarriers produced at the pn junction interface in first semiconductor portion 4a and second semiconductor portion 4b. As a result, the response speed of the electromagnetic wave detector is enhanced.

It is preferable that the thickness T1 of first semiconductor portion 4a is 10 µm or less. When the thickness T1 of first semiconductor portion 4a is reduced, junction portion 4aa that is the pn junction interface comes closer to two-dimensional material layer 1, and optical carriers produced in the pn junction interface are less deactivated. Furthermore, since junction portion 4aa that is the pn junction interface is in proximity to insulating film 3, the influence of the optical gate effect on two-dimensional material layer 1 is increased. As a result, higher sensitivity of the electromagnetic wave detector can be achieved. The optical gate effect will be described later.

Insulating film 3 is provided on front surface 4ab of first semiconductor portion 4a. For example, an insulating film made of silicon oxide can be used as insulating film 3. The material forming insulating film 3 is not limited to silicon oxide described above and other insulating materials may be used. For example, tetraethyl orthosilicate, silicon nitride, hafnium oxide, aluminum oxide, nickel oxide, boron nitride, or a siloxane-based polymer material may be used as the material forming insulating film 3. For example, boron nitride having an atomic arrangement similar to that of graphene does not adversely affect the charge carrier mobility even when in contact with two-dimensional material layer 1 made of graphene. Therefore, it does not hinder the performance of two-dimensional material layer 1, such as electron mobility, and is preferable as insulating film 3 that is an underlying film disposed under two-dimensional material layer 1.

The thickness T2 of insulating film 3 is not limited as long as a region of two-dimensional material layer 1 positioned above insulating film 3 and first electrode part 2a are insulated from first semiconductor portion 4a, and tunnel current does not occur. The smaller the thickness T2 of insulating film 3 is, the larger the degree of electric field change in two-dimensional material layer 1 by the optical gate effect is. It is therefore preferable that the thickness T2 of insulating film 3 is as small as possible.

As shown in FIG. 2, two-dimensional material layer 1 is provided to extend from a surface of an upper portion of insulating film 3 onto a part of front surface 4ab of first semiconductor portion 4a. That is, two-dimensional material layer 1 is in contact with front surface 4ab of first semiconductor portion 4a in the inside of opening portion 3a of insulating film 3. Two-dimensional material layer 1 extends from the inside of opening portion 3a onto the surface of the upper portion of insulating film 3 through the inner peripheral surface of opening portion 3a. Here, in FIG. 2, the right end of two-dimensional material layer 1 extends to the right end of opening portion 3a but it is only necessary to be in contact with a part of front surface 4ab of first semiconductor portion 4a, and the right end of two-dimensional material layer 1 may extend from opening portion 3a to insulating film 3 on the other end. For example, monolayer graphene may be used as two-dimensional material layer 1. The monolayer graphene is a single atomic layer of two-dimensional carbon crystal. The monolayer graphene has carbon atoms in chains disposed in a hexagonal shape.

Two-dimensional material layer 1 is divided into a channel region and a region functioning as a source/drain layer. Region 1a functioning as a source/drain region in two-dimensional material layer 1 is electrically connected to first electrode part 2a and first semiconductor portion 4a. Region 1b functioning as a channel region in two-dimensional material layer 1 is formed on insulating film 3 formed on light-receiving element 4.

Here, multilayer graphene in which two or more layers of monolayer graphene are stacked may be used as two-dimensional material layer 1. Furthermore, non-doped graphene may be used, or graphene doped with a p-type impurity or an n-type impurity may be used for two-dimensional material layer 1.

When multilayer graphene is used for two-dimensional material layer 1, the photoelectric conversion ratio of two-dimensional material layer 1 is increased, and the sensitivity of the electromagnetic wave detector is increased. In multilayer graphene used as two-dimensional material layer 1, the directions of lattice vectors of the hexagonal lattices in any two layers of graphene may be matched or may not be matched. For example, two or more layers of graphene are stacked to form a bandgap in two-dimensional material layer 1. This imparts the wavelength selective effect for electromagnetic waves subjected to photoelectric conversion. As the number of layers in multilayer graphene forming two-dimensional material layer 1 increases, the mobility of carriers in the channel region decreases. On the other hand, in this case, two-dimensional material layer 1 is less affected by carrier scattering from the underlying structure such as the substrate, and consequently the noise level is lowered. In the electromagnetic wave detector including multilayer graphene as two-dimensional material layer 1, therefore, light absorption is increased, and the detection sensitivity of electromagnetic waves can be increased.

When two-dimensional material layer 1 is in contact with first electrode part 2a, carriers are doped from first electrode part 2a to two-dimensional material layer 1. For example, when gold (Au) is used as the material of first electrode part 2a, holes are doped into two-dimensional material layer 1 in proximity to first electrode part 2a because of the difference in work function between two-dimensional material layer 1 and Au. In this state, when the electromagnetic wave detector is driven in an electron conducting state, the mobility of electrons flowing in the channel region of two-dimensional material layer 1 decreases under the effect of the holes doped from first electrode part 2a into two-dimensional material layer 1, and the contact resistance between two-dimensional material layer 1 and first electrode part 2a increases. The increase of contact resistance reduces the mobility of electrons (carriers) due to the electric field effect in the electromagnetic wave detector and may deteriorate the performance of the electromagnetic wave detector. In particular, when monolayer graphene is used as two-dimensional material layer 1, the amount of doping of carriers injected from first electrode part 2a is large. Therefore, the reduction in mobility of electrons in the electromagnetic wave detector is noticeable particularly when monolayer graphene is used as two-dimensional material layer 1. Therefore, when two-dimensional material layer 1 is entirely formed with monolayer graphene, there is a possibility that the performance of the electromagnetic wave detector is deteriorated.

Hence, multilayer graphene may be formed in region 1a electrically connected to first electrode part 2a of two-dimensional material layer 1 that is easily doped with carriers from first electrode part 2a. The carrier doping from first electrode part 2a is smaller in multilayer graphene than in monolayer graphene. Thus, the increase of contact resistance between two-dimensional material layer 1 and first electrode part 2a can be suppressed. As a result, the reduction in mobility of electrons in the electromagnetic wave detector can be suppressed, and the performance of the electromagnetic wave detector can be enhanced.

Furthermore, multilayer graphene may be used for region 1a functioning as a source/drain region, and monolayer graphene may be used for region 1b functioning as a channel region. With such a configuration, high mobility of electrons in the channel region can be achieved. As a result, the increase of contact resistance can be suppressed, the high mobility of electrons can be maintained, and the performance of the electromagnetic wave detector can be enhanced.

Graphene in the shape of nanoribbons (hereinafter referred to as graphene nanoribbons) may be used as two-dimensional material layer 1. In this case, for example, a single graphene nanoribbon, a complex of a stack of graphene nanoribbons, or a structure of graphene nanoribbons periodically arranged on a plane can be used as two-dimensional material layer 1. For example, when a structure of graphene nanoribbons periodically arranged is used as two-dimensional material layer 1, plasmon resonance can be produced in the graphene nanoribbons. As a result, the sensitivity of the electromagnetic wave detector can be enhanced. Here, the structure of graphene nanoribbons periodically arranged may be called graphene metamaterial. The effect described above therefore can also be achieved in the electromagnetic wave detector including graphene metamaterial as two-dimensional material layer 1.

First electrode part 2a is formed on insulating film 3. Second electrode part 2b is formed on the back surface of second semiconductor portion 4b. Any material that is a conductor can be used as the material forming first electrode part 2a and second electrode part 2b. For example, a metal material such as gold (Au), silver (Ag), copper (Cu), aluminum (Al), nickel (Ni), chromium (Cr), or palladium (Pd) can be used as the material. Furthermore, a not-shown adhesion layer may be formed between first electrode part 2a and insulating film 3 or between second electrode part 2b and second semiconductor portion 4b. The adhesion layer enhances the adhesion between first electrode part 2a and insulating film 3 or the adhesion between second electrode part 2b and second semiconductor portion 4b. Any material can be used as the material forming the adhesion layer and, for example, a metal material such as chromium (Cr) or titanium (Ti) may be used. In FIG. 2, first electrode part 2a is formed below two-dimensional material layer 1, but first electrode part 2a may be formed above two-dimensional material layer 1. Furthermore, in FIG. 2, second electrode part 2b is provided on the entire surface of the lower layer of second semiconductor portion 4b. However, it is only necessary that second electrode part 2b is in contact with a part of second semiconductor portion 4b. For example, another opening portion may be provided in a side surface and a part of the bottom surface of second semiconductor portion 4b and insulating film 3, and second electrode part 2b may be provided on a surface exposing second semiconductor portion 4b in the opening portion. In this manner, electromagnetic waves incident from the back surface of the electromagnetic wave detector can be detected. When electromagnetic waves are applied from the front surface side of the electromagnetic wave detector, because of second electrode part 2b provided on the entire back surface as shown in FIG. 2, the electromagnetic waves not absorbed but transmitted through light-receiving element 4 are reflected by second electrode part 2b, whereby the absorption ratio of electromagnetic waves in light-receiving element 4 can be increased.

Furthermore, a not-shown protective film may be formed on two-dimensional material layer 1. The protective film may be provided to cover the periphery of two-dimensional material layer 1, first semiconductor portion 4a, and first electrode part 2a on insulating film 3. Any material can be used as the material forming the protective film and, for example, an insulating film made of silicon oxide can be used as the protective film. An insulator such as oxide or nitride, for example, silicon oxide, silicon nitride, hafnium oxide, aluminum oxide, and boron nitride, may be used as the material forming the protective film.

The electromagnetic wave detector according to the present embodiment is thus configured.

<Method of Manufacturing Electromagnetic Wave Detector>

Figure 3:
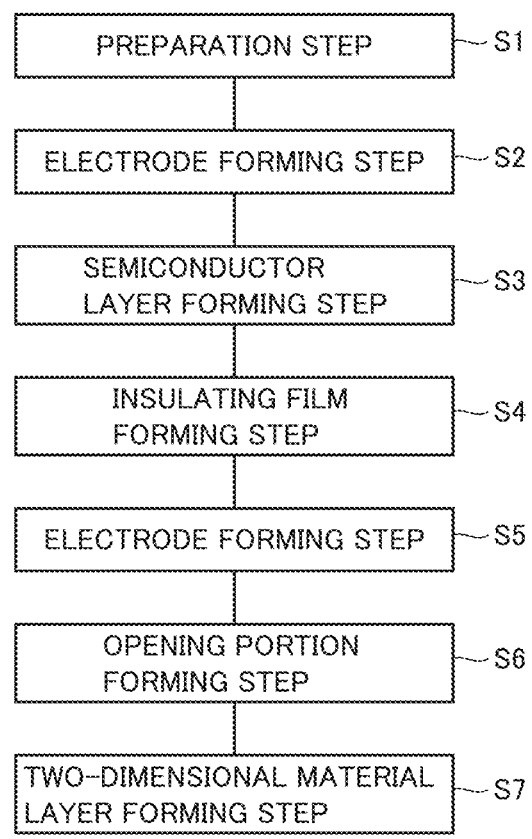
FIG. 3 is a flowchart for explaining a method of manufacturing an electromagnetic wave detector according to the first embodiment.

FIG. 3 is a flowchart for explaining a method of manufacturing an electromagnetic wave detector according to the first embodiment. Referring to FIG. 3, a method of manufacturing the electromagnetic wave detector shown in FIG. 1 and FIG. 2 will be described.

First of all, a preparation step (S1) shown in FIG. 3 is performed. In this step (S1), second semiconductor portion 4b which is a flat substrate made of, for example, silicon is prepared.

Subsequently, an electrode forming step (S2) is performed. In this step (S2), second electrode part 2b is formed on the back surface of second semiconductor portion 4b. Specifically, first, a protective film is formed on the front surface of second semiconductor portion 4b. For example, a resist is used as the protective film. In this state, second electrode part 2b is formed on the back surface of second semiconductor portion 4b. For example, metal such as gold (Au), silver (Ag), copper (Cu), aluminum (Al), nickel (Ni), or chromium (Cr) can be used as the material forming second electrode part 2b. In this step, an adhesion layer may be formed on the back surface of second semiconductor portion 4b, prior to second electrode part 2b, in order to enhance the adhesion between second semiconductor portion 4b and second electrode part 2b. For example, copper (Cr) or titanium (Ti) can be used as the material of the adhesion layer.

Subsequently, a semiconductor layer forming step (S3) is performed. In this step (S3), first, the resist formed as the protective film on the front surface of second semiconductor portion 4b is removed. Subsequently, first semiconductor portion 4a is formed on the front surface of second semiconductor portion 4b. First semiconductor portion 4a may be doped with an impurity, for example, by ion implantation to second semiconductor portion 4b.

Subsequently, an insulating film forming step (S4) is performed. In this step (S4), insulating film 3 is formed on front surface 4ab of first semiconductor portion 4a. For example, when first semiconductor portion 4a is silicon, insulating film 3 may be silicon oxide ($SiO_2$) formed by partially thermally oxidizing the surface on the side opposite to the surface facing second semiconductor portion 4b in first semiconductor portion 4a. Alternatively, the insulating layer may be formed on the front surface of first semiconductor portion 4a by chemical vapor deposition (CVD) or sputtering.

Subsequently, an electrode forming step (S5) is performed. In this step (S5), first electrode part 2a is formed on insulating film 3. For example, metal such as gold (Au), silver (Ag), copper (Cu), aluminum (Al), nickel (Ni), or chromium (Cr) is used as the material forming first electrode part 2a. In this step, an adhesion layer may be formed between insulating film 3 and first electrode part 2a in order to enhance the adhesion between first electrode part 2a and insulating film 3. For example, chromium (Cr) or titanium (Ti) can be used as the material of the adhesion layer.

For example, the following process can be used as a method of forming first electrode part 2a. First, a resist mask is formed on the front surface of insulating film 3 using photolithography or electron beam (EB) lithography. An opening is formed in a region where first electrode part 2a is to be formed in the resist mask. Subsequently, a film made of metal or the like to serve as first electrode part 2a is formed on the resist mask. The film can be formed by, for example, vapor deposition or sputtering. In doing so, the film is formed so as to extend from the inside of the opening portion of the resist mask to the surface of the upper portion of the resist mask. Subsequently, the resist mask is removed together with a part of the film, so that another part of the film disposed in the opening portion of the resist mask is left on the front surface of insulating film 3 to serve as first electrode part 2a. The foregoing method is a method commonly called lift-off.

Another method may be used to form first electrode part 2a. For example, a film such as a metal film to serve as first electrode part 2a is formed first on the front surface of insulating film 3. Subsequently, a resist mask is formed on the film by photolithography. The resist mask is formed to cover the region where first electrode part 2a is to be formed, but is not formed in the region other than the region where first electrode part 2a is to be formed. Subsequently, the film is partially removed using the resist mask as a mask by wet etching or dry etching. As a result, a part of the film is left under the resist mask. This part of the film serves as first electrode part 2a. Subsequently, the resist mask is removed. First electrode part 2a may be formed in this way.

Subsequently, an opening portion forming step (S6) is performed. In this step (S6), opening portion 3a is formed in insulating film 3. Specifically, a resist mask is formed on insulating film 3 using photolithography or EB lithography. An opening is formed in a region where opening portion 3a of insulating film 3 is to be formed in the resist mask. Subsequently, insulating film 3 is partially removed using the resist mask as a mask by wet etching or dry etching to form opening portion 3a. Subsequently, the resist mask is removed. The step (S6) may be performed before the step (S5).

Subsequently, a two-dimensional material layer forming step (S7) is performed. In this step (S7), two-dimensional material layer 1 is formed to cover first electrode part 2a, insulating film 3, and the entire part of first semiconductor portion 4a exposed in opening portion 3a of insulating film 3. Two-dimensional material layer 1 may be formed by any method. For example, two-dimensional material layer 1 may be formed by epitaxial growth, or two-dimensional material layer 1 formed by CVD in advance may be transferred and affixed to first electrode part 2a, insulating film 3, and a part of first semiconductor portion 4a. Alternatively, two-dimensional material layer 1 may be formed, for example, by screen printing. Furthermore, two-dimensional material layer 1 mechanically peeled off may be transferred onto first electrode part 2a and the like described above. Subsequently, a resist mask is formed on two-dimensional material layer 1, for example, by photolithography. The resist mask is formed to cover the region where two-dimensional material layer 1 is to be left, but is not formed in the region where two-dimensional material layer 1 is not to be left. Subsequently, using the resist mask as a mask, two-dimensional material layer 1 is partially removed by etching with oxygen plasma. Thus, an unnecessary part of the two-dimensional material layer is removed, and two-dimensional material layer 1 as shown in FIG. 1 and FIG. 2 is formed. Subsequently, the resist mask is removed.

The processes (S1 to S7) described above produce the electromagnetic wave detector shown in FIG. 1 and FIG. 2. In the foregoing manufacturing method, two-dimensional material layer 1 is formed on first electrode part 2a. However, two-dimensional material layer 1 may be formed on insulating film 3 in advance, and first electrode part 2a may be formed to overlap with a part of two-dimensional material layer 1. When this structure is used, however, attention is needed so as not give process damage to two-dimensional material layer 1 in forming first electrode part 2a. For example, a possible measure is to form first electrode part 2a in a state in which the region other than the region where first electrode part 2a is superimposed in two-dimensional material layer 1 is covered with a protective film or the like in advance.

<Operation Principle of Electromagnetic Wave Detector>

The operation principle of the electromagnetic wave detector according to the present embodiment will now be described.

First, as shown in FIG. 2, a power supply circuit for applying a voltage V is electrically connected between first electrode part 2a and second electrode part 2b. In this case, current I flows through two-dimensional material layer 1 serving as a part of a current path between first electrode part 2a and second electrode part 2b. A not-shown ammeter is installed in the power supply circuit, and the ammeter monitors current I flowing through two-dimensional material layer 1.

Subsequently, light-receiving element 4 including first semiconductor portion 4a and second semiconductor portion 4b is irradiated with electromagnetic waves. In this case, photoelectric conversion occurs in the pn junction of light-receiving element 4, and photocurrent flows through two-dimensional material layer 1.

Furthermore, light-receiving element 4 applies electric field change to two-dimensional material layer 1 through insulating film 3. As a result, a gate voltage is applied to two-dimensional material layer 1 in a pseudo manner, and the resistance value in two-dimensional material layer 1 changes. This is called optical gate effect. The change in resistance value of two-dimensional material layer 1 changes current I that is photocurrent flowing through two-dimensional material layer 1. The electromagnetic wave applied to the electromagnetic wave detector can be detected by detecting the change of current I.

For example, when first semiconductor portion 4a of light-receiving element 4 is made of an n-type material and second semiconductor portion 4b is made of a p-type material, current I can be nulled by adjusting voltage V and allowing light-receiving element 4 to perform reverse bias operation. That is, the electromagnetic wave detector according to the present embodiment is capable of the OFF operation. In doing so, since current flows through light-receiving element 4 only at the time of light radiation, current I can be detected only at the time of light radiation.

Here, the electromagnetic wave detector according to the present embodiment is not limited to the configuration that detects change of current in two-dimensional material layer 1 as described above. Fr example, constant current may be fed between first electrode part 2a and second electrode part 2b, and change in voltage V between first electrode part 2a and second electrode part 2b (that is, change in voltage value in two-dimensional material layer 1) may be detected.

Furthermore, two or more identical electromagnetic wave detectors may be used to detect electromagnetic waves. For example, two identical electromagnetic wave detectors are prepared. One of the electromagnetic wave detectors is disposed in a shielded space not irradiated with electromagnetic waves. The other electromagnetic wave detector is disposed in a space to be irradiated with electromagnetic waves to be measured. Then, the difference between current I or voltage V of the other electromagnetic wave detector irradiated with electromagnetic waves and current I or voltage V of the electromagnetic wave detector disposed in the shielded space is detected. Electromagnetic waves may be detected in this way.

<Operation of Electromagnetic Wave Detector>

A specific operation of the electromagnetic wave detector shown in FIG. 1 and FIG. 2 will now be described. Here, p-type silicon is used as second semiconductor portion 4b, and n-type silicon is used as first semiconductor portion 4a.

As shown in FIG. 2, when a voltage is applied as reverse bias to light-receiving element 4, a depletion layer is formed in proximity to junction portion 4aa that is the interface between first semiconductor portion 4a and second semiconductor portion 4b. The range of detection wavelengths of the electromagnetic wave detector is determined depending on the constituent material of light-receiving element 4. The detection wavelengths of the electromagnetic wave detector having light-receiving element 4 configured as described above are 0.2 µm to 1.1 µm.

When electromagnetic waves having the detection wavelengths above are incident on light-receiving element 4, electron-hole pairs are produced in the depletion layer. The produced electron-hole pairs (optical carriers) are extracted as photocurrent from first electrode part 2a and second electrode part 2b. At this time, the optical carriers produced in a region immediately below insulating film 3 cause electric field change in two-dimensional material layer 1 through insulating film 3. This is the optical gate effect described above. As described above, graphene forming two-dimensional material layer 1 exhibits high mobility and provides a large displacement current for a slight electric field change. Therefore, photocurrent passing through two-dimensional material layer 1 through photoelectric conversion of light-receiving element 4 and extracted from first electrode part 2a is significantly amplified by the optical gate effect. Thus, high sensitivity exceeding the quantum efficiency of silicon can be achieved in the electromagnetic wave detector according to the present embodiment. In this case, it is preferable that light-receiving element 4 is designed such that the carrier diffusion length is short. With the shorter carrier diffusion length, the carrier life of optical carriers in light-receiving element 4 is shorter. As a result, delay of amplification by the optical gate effect is eliminated, the optical carriers produced by photoelectric conversion of light-receiving element 4 can be separated from the amplification by the optical gate effect, and high-speed response of the electromagnetic wave detector can be achieved.

<Operation Effect>

The electromagnetic wave detector according to the present disclosure includes light-receiving element 4, insulating film 3, two-dimensional material layer 1, first electrode part 2a, and second electrode part 2b. Light-receiving element 4 includes first semiconductor portion 4a of a first conductivity type and second semiconductor portion 4b. Second semiconductor portion 4b is joined to first semiconductor portion 4a. Second semiconductor portion 4b is of a second conductivity type different from the first conductivity type. Insulating film 3 is disposed on light-receiving element 4. More specifically, insulating film 3 is disposed on first semiconductor portion 4a. Insulating film 3 has opening portion 3a. Two-dimensional material layer 1 is electrically connected to first semiconductor portion 4a in opening portion 3a. More specifically, first semiconductor portion 4a is electrically connected to two-dimensional material layer 1 in opening portion 3a. Two-dimensional material layer 1 extends from on opening portion 3a onto insulating film 3. First electrode part 2a is disposed on insulating film 3. First electrode part 2a is electrically connected to two-dimensional material layer 1. Second electrode part 2b is electrically connected to second semiconductor portion 4b.

First semiconductor portion 4a is disposed on second semiconductor portion 4b. Second electrode part 2b is provided on the side opposite to the side having first semiconductor portion 4a in second semiconductor portion 4b. Second electrode part 2b is electrically connected to second semiconductor portion 4b. Two-dimensional material layer 1 contains a material selected from the group consisting of graphene, transition metal dichalcogenide, black phosphorus, silicene, graphene nanoribbon, and borophene.

A portion disposed on opening portion 3a in two-dimensional material layer 1 is configured such that photocurrent can be input from light-receiving element 4. Specifically, for example, in opening portion 3a, two-dimensional material layer 1 may be in direct contact with light-receiving element 4. Alternatively, in opening portion 3a, a tunnel insulating film may be disposed between two-dimensional material layer 1 and light-receiving element 4, and photocurrent may be injected from light-receiving element 4 through the tunnel insulating film. Furthermore, a region positioned on insulating film 3 in two-dimensional material layer 1 is opposed to light-receiving element 4 with insulating film 3 interposed. When light-receiving element 4 is irradiated with electromagnetic waves, light-receiving element 4 applies electric field change to the region of two-dimensional material layer 1 through insulating film 3. As a result, the optical gate effect is achieved, that is, a gate voltage is applied to two-dimensional material layer 1 in a pseudo manner, and the resistance value in two-dimensional material layer 1 changes. With this optical gate effect, the conductivity of the two-dimensional material layer 1 is modulated, and consequently, photocurrent can be amplified in two-dimensional material layer 1.

From a different point of view, the electromagnetic wave detector is characterized in that two-dimensional material layer 1 has region 1c directly connected to light-receiving element 4 (the region positioned inside opening portion 3a) and region 1b connected to light-receiving element 4 through insulating film 3. Since two-dimensional material layer 1 is directly connected to light-receiving element 4, current does not flow in the electromagnetic wave detector and the OFF operation is enabled when reverse bias is applied to light-receiving element 4. In the electromagnetic wave detector, noise is reduced, and photocurrent produced by electromagnetic wave radiation is extracted through two-dimensional material layer 1.

Furthermore, region 1b of two-dimensional material layer 1 is connected to light-receiving element 4 through insulating film 3. Therefore, when light-receiving element 4 is irradiated with electromagnetic waves, a gate voltage is applied to two-dimensional material layer 1 in a pseudo manner by the optical gate effect as described above. As a result, the conductivity of two-dimensional material layer 1 is modulated, and photocurrent injected from light-receiving element 4 into two-dimensional material layer 1 can be amplified. Accordingly, the electromagnetic wave detector can achieve high sensitivity with quantum efficiency of 100% or higher and with sensitivity more than 100 times higher than usual.

The effect described above will be described in detail below. When an electromagnetic wave is incident on the electromagnetic wave detector, photocurrent is produced at the pn junction of light-receiving element 4. At this moment, the produced photocurrent (optical carriers) is extracted from first electrode part 2a and second electrode part 2b through two-dimensional material layer 1 and second semiconductor portion 4b.

At this time, the electric field change that occurs at the pn junction of light-receiving element 4 causes electric field change in two-dimensional material layer 1 through insulating film 3. As a result, the resistance of two-dimensional material layer 1 is changed. As described above, such an effect is called optical gate effect or optical switch. The optical carriers extracted from light-receiving element 4 are amplified in two-dimensional material layer 1 by the optical gate effect and detected, whereby incidence of electromagnetic waves can be detected in the electromagnetic wave detector.

For example, when monolayer graphene is used as two-dimensional material layer 1, the thickness of this two-dimensional material layer 1 is equivalent to one atomic layer and is extremely thin. The mobility of electrons in monolayer graphene is large. Therefore, in two-dimensional material layer 1, a large current change occurs for a slight potential change, compared with common semiconductor. For example, the current change amount caused by potential change applied to two-dimensional material layer 1 due to electric field change in light-receiving element 4 is larger than the current change amount in common semiconductor. Specifically, when calculated from the mobility of electrons in two-dimensional material layer 1 and the thickness, the current change amount in two-dimensional material layer 1 is about a few hundreds to a few thousands as large as the current change amount in common semiconductor.

Therefore, the efficiency of extracting detection current in two-dimensional material layer 1 is significantly improved by using the optical gate effect. Such optical gate effect does not directly enhance the quantum efficiency of the photoconversion material in light-receiving element 4 but increases the current change by incidence of electromagnetic waves. Therefore, the quantum efficiency equivalently calculated from differential current by incidence of electromagnetic waves can exceed 100%. The electromagnetic wave detector according to the present embodiment therefore can detect electromagnetic waves with high sensitivity compared with a conventional semiconductor electromagnetic wave detector or a graphene electromagnetic wave detector that does not employ the optical gate effect.

Furthermore, in the electromagnetic wave detector according to the present embodiment, photocurrent resulting from the photoelectric conversion efficiency intrinsic to two-dimensional material layer 1 is produced, in addition to the current produced in light-receiving element 4. Therefore, the electromagnetic wave detector according to the present embodiment can detect the current produced in light-receiving element 4 and the current involved with the optical gate effect as well as the photocurrent resulting from the photoelectric conversion efficiency intrinsic to two-dimensional material layer 1.

As described above, the electromagnetic wave detector according to the present embodiment can achieve both high sensitivity with quantum efficiency of 100% or more and the OFF operation.

In the electromagnetic wave detector, light-receiving element 4 includes first semiconductor portion 4a and second semiconductor portion 4b. First semiconductor portion 4a has a first conductivity type. Second semiconductor portion 4b is joined to first semiconductor portion 4a. Second semiconductor portion 4b has a second conductivity type different from the first conductivity type. The electrical resistivity of at least one of first semiconductor portion 4a and second semiconductor portion 4b is equal to or smaller than 100 Ω·cm.

In this case, the moving speed in light-receiving element 4 of optical carriers (photocurrent) generated in light-receiving element 4 can be enhanced. As a result, the response speed of the electromagnetic wave detector can be enhanced.

In the electromagnetic wave detector, insulating film 3 is formed on front surface 4ab positioned on the side opposite to junction portion 4aa joined to second semiconductor portion in first semiconductor portion 4a. The thickness T1 of first semiconductor portion 4a positioned between junction portion 4aa and front surface 4ab is 10 μm or smaller.

In this case, the thickness T1 of first semiconductor portion 4a is reduced to 10 μm or smaller, whereby junction portion 4aa that is the pn junction interface comes closer to two-dimensional material layer 1. Therefore, deactivation of the optical carriers generated at the pn junction interface is reduced. Furthermore, since junction portion 4aa that is the pn junction interface is in proximity to insulating film 3, a voltage change that occurs at the pn junction interface is easily transferred to two-dimensional material layer 1, thereby increasing the optical gate effect for two-dimensional material layer 1. As a result, higher sensitivity of the electromagnetic wave detector can be achieved.

In the electromagnetic wave detector, light-receiving element 4 includes first semiconductor portion 4a and second semiconductor portion 4b. First semiconductor portion 4a has a first conductivity type. Second semiconductor portion 4b is joined to first semiconductor portion 4a. Second semiconductor portion 4b has a second conductivity type different from the first conductivity type. First semiconductor portion 4a and second semiconductor portion 4b have different absorption wavelengths. In this case, multiple wavelengths can be detected in the electromagnetic wave detector.

Second Embodiment

<Configuration of Electromagnetic Wave Detector>

Figure 4:
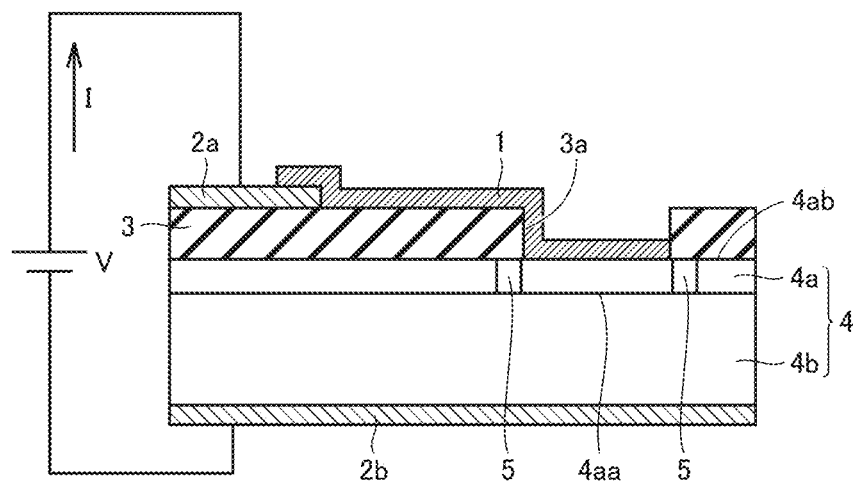
FIG. 4 is a cross-sectional view of the electromagnetic wave detector according to a second embodiment.
Figure 5:
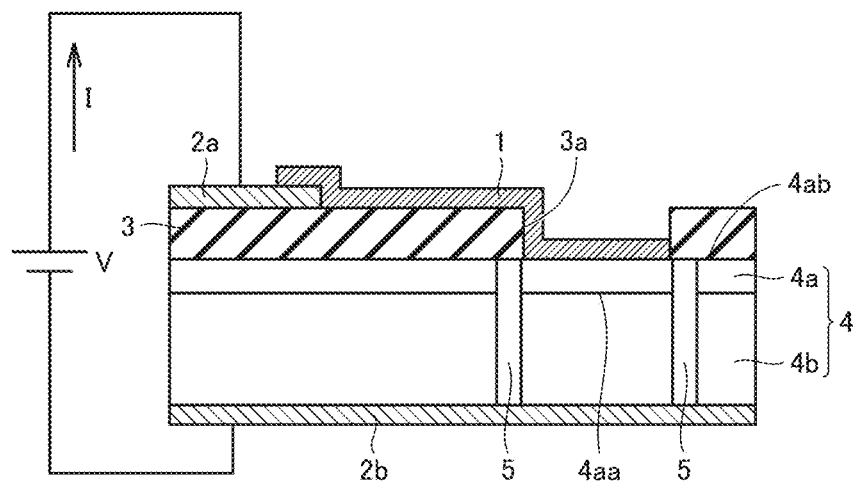
FIG. 5 is a cross-sectional view of a first modification of the electromagnetic wave detector according to the second embodiment.
Figure 6:
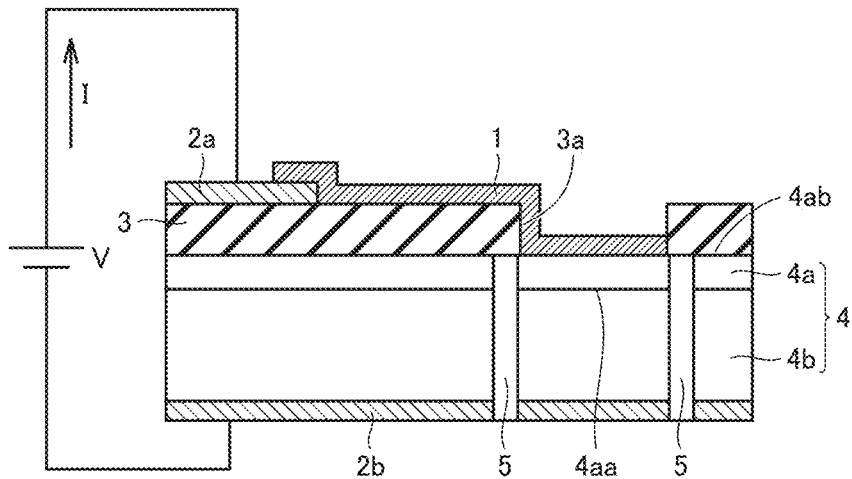
FIG. 6 is a cross-sectional view of a second modification of the electromagnetic wave detector according to the second embodiment.

FIG. 4 is a cross-sectional view of the electromagnetic wave detector according to a second embodiment. FIG. 5 is a cross-sectional view of a first modification of the electromagnetic wave detector according to the second embodiment. FIG. 6 is a cross-sectional view of a second modification of the electromagnetic wave detector according to the second embodiment. FIG. 4 to FIG. 6 each correspond to FIG. 2.

The electromagnetic wave detector shown in FIG. 4 basically has a configuration similar to the electromagnetic wave detector shown in FIG. 1 and FIG. 2 and can achieve a similar effect but differs from the electromagnetic wave detector shown in FIG. 1 and FIG. 2 in configuration of light-receiving element 4. More specifically, in the electromagnetic wave detector shown in FIG. 4, light-receiving element 4 includes a current cut-off mechanism 5. Current cut-off mechanism 5 is a portion that can cut off current. Current cut-off mechanism 5 is positioned at a region opposed to insulating film 3 in first semiconductor portion 4a. Current cut-off mechanism 5 is formed at a position surrounding the outer periphery of opening portion 3a in first semiconductor portion 4a.

From a different point of a view, the electromagnetic wave detector according to the present embodiment includes current cut-off mechanism 5 in first semiconductor portion 4a opposed to the outer peripheral region of opening portion 3a of insulating film 3. Current cut-off mechanism 5 may be any structure that cuts off current. For example, a trench formed in light-receiving element 4 may be used as current cut-off mechanism 5. The inside of the trench may be the air, or the inside of the trench may be filled with an insulator. Furthermore, a portion doped with an impurity more heavily than first semiconductor portion 4a and second semiconductor portion 4b to increase the conductivity from that of first semiconductor portion 4a and second semiconductor portion 4b may be used as current cut-off mechanism 5. Alternatively, a trench may be formed in first semiconductor portion 4a as described above, and a metal material buried in the trench to increase the conductivity may be used as current cut-off mechanism 5.

The electromagnetic wave detector shown in FIG. 5 basically has a configuration similar to the electromagnetic wave detector shown in FIG. 4 but differs from the electromagnetic wave detector shown in FIG. 4 in configuration of light-receiving element 4. More specifically, in the electromagnetic wave detector shown in FIG. 5, current cut-off mechanism 5 is formed in both of first semiconductor portion 4a and second semiconductor portion 4b. Specifically, current cut-off mechanism 5 extends from front surface 4ab of first semiconductor portion 4a to the back surface having second electrode part 2b in second semiconductor portion 4b.

The electromagnetic wave detector shown in FIG. 6 basically has a configuration similar to the electromagnetic wave detector shown in FIG. 4 but differs from the electromagnetic wave detector shown in FIG. 4 in configuration of light-receiving element 4. More specifically, in the electromagnetic wave detector shown in FIG. 6, current cut-off mechanism 5 is formed in first semiconductor portion 4a, second semiconductor portion 4b, and second electrode part 2b. Specifically, current cut-off mechanism 5 penetrates from front surface 4ab of first semiconductor portion 4a through first semiconductor portion 4a, second semiconductor portion 4b, and second electrode part 2b and extends to the surface of second electrode part 2b.

<Operation Effect>

In the electromagnetic wave detector described above, light-receiving element 4 includes current cut-off mechanism 5. Current cut-off mechanism 5 is positioned at a region opposed to insulating film 3. Current cut-off mechanism 5 is disposed to surround the outer periphery of opening portion 3a.

In this case, current cut-off mechanism 5 can separate the optical carriers produced at the pn junction interface into carriers to be injected to two-dimensional material layer 1 and carriers to contribute to the optical gate effect of applying electric field change to two-dimensional material layer 1 through insulating film 3. For example, when the width of opening portion 3a in insulating film 3 is smaller than the diffusion length of optical carriers in the material (for example, semiconductor material) forming first semiconductor portion 4a, the optical carriers produced at the pn junction interface under insulating film 3 contribute to the optical gate effect and are injected into two-dimensional material layer 1. This may cause reduction of response speed in the electromagnetic wave detector. However, as described above, current cut-off mechanism 5 can separate the optical carriers into carriers to contribute to the optical gate effect and carriers to be injected to two-dimensional material layer 1. As a result, the response speed of the electromagnetic wave detector can be enhanced. In addition, when the electromagnetic wave detectors are arranged in an array, the effect of separating pixels can be achieved.

Here, the configuration of the electromagnetic wave detector according to the present embodiment can be applied to other embodiments.

Third Embodiment

<Configuration of Electromagnetic Wave Detector>

Figure 7:
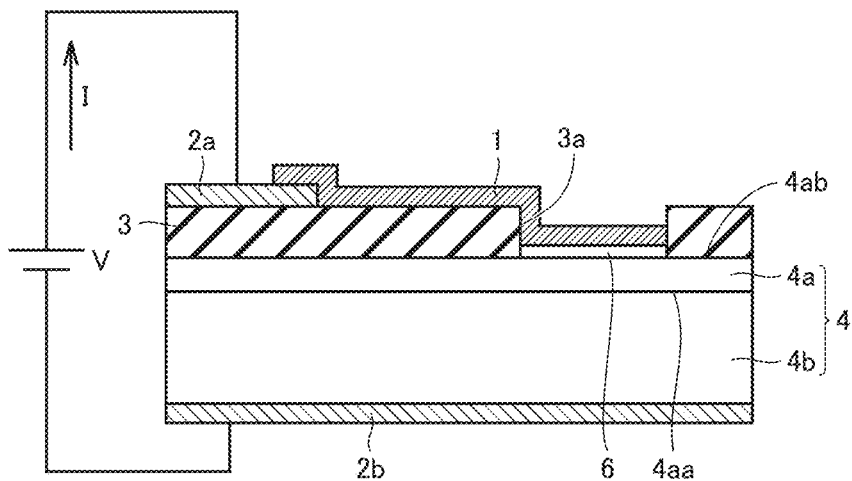
FIG. 7 is a cross-sectional view of the electromagnetic wave detector according to a third embodiment.
Figure 8:
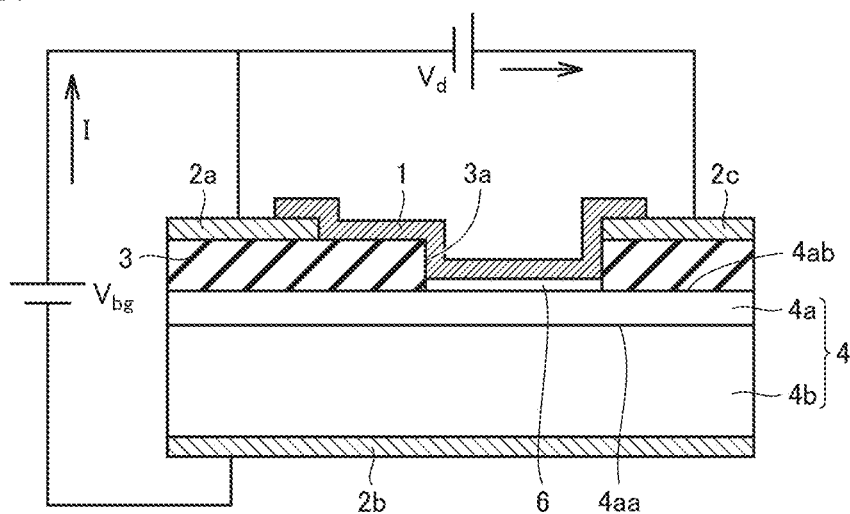
FIG. 8 is a cross-sectional view of a modification of the electromagnetic wave detector according to the third embodiment.

FIG. 7 is a cross-sectional view of the electromagnetic wave detector according to a third embodiment. FIG. 8 is a cross-sectional view of a modification of the electromagnetic wave detector according to the third embodiment. FIG. 7 corresponds to FIG. 2.

The electromagnetic wave detector shown in FIG. 7 basically has a configuration similar to the electromagnetic wave detector shown in FIG. 1 and FIG. 2 and can achieve a similar effect but differs from the electromagnetic wave detector shown in FIG. 1 and FIG. 2 in configuration of a connection portion between light-receiving element 4 and two-dimensional material layer 1. More specifically, in the electromagnetic wave detector shown in FIG. 7, a buffer layer 6 is disposed between two-dimensional material layer 1 and light-receiving element 4 in the inside of opening portion 3a of insulating film 3

An insulating film, for example, having a thickness of 1 nm to 10 nm can be used as buffer layer 6. Any material can be used as the material of the insulating film. For example, a metal oxide such as alumina or hafnium oxide, an oxide or a nitride containing semiconductor such as silicon oxide or silicon nitride, or boron nitride may be used as the material of the insulating film. Any method can be used as a method of fabricating buffer layer 6. For example, buffer layer 6 may be fabricated by atomic layer deposition (ALD), vacuum evaporation, or sputtering. Alternatively, buffer layer 6 may be formed by oxidizing or nitriding the surface of first semiconductor portion 4a. Alternatively, a natural oxide film formed on the surface of first semiconductor portion 4a may be used as buffer layer 6.

Furthermore, in the electromagnetic wave detector according to the present embodiment, as shown in FIG. 8, an electrode part 2c different from first electrode part 2a may be provided on the front surface of insulating film 3. Electrode part 2c is preferably disposed at a region on the side opposite to the region having first electrode part 2a as viewed from opening portion 3a. Two-dimensional material layer 1 is also connected to electrode part 2c. A source-drain voltage Vd may be applied between first electrode part 2a and electrode part 2c. In this way, photocurrent extracted from two-dimensional material layer 1 can be increased.

Here, the configuration of the electromagnetic wave detector according to the present embodiment can be applied to other embodiments.

<Operation Effect>

The electromagnetic wave detector described above includes buffer layer 6. Buffer layer 6 is disposed between two-dimensional material layer 1 and light-receiving element 4 in the inside of opening portion 3a. Buffer layer 6 has a thickness that allows tunnel current to be formed between two-dimensional material layer 1 and light-receiving element 4. In this case, the film thickness of buffer layer 6 is set to a thickness to such a degree that produces tunnel injection from light-receiving element 4 to two-dimensional material layer 1, whereby the injection efficiency is improved and thus large photocurrent is injected into two-dimensional material layer 1, thereby enhancing the sensitivity of the electromagnetic wave detector. Furthermore, buffer layer 6 suppresses leak current at the junction interface between light-receiving element 4 and two-dimensional material layer 1, thereby reducing dark current.

Fourth Embodiment

<Configuration of Electromagnetic Wave Detector>

Figure 9:
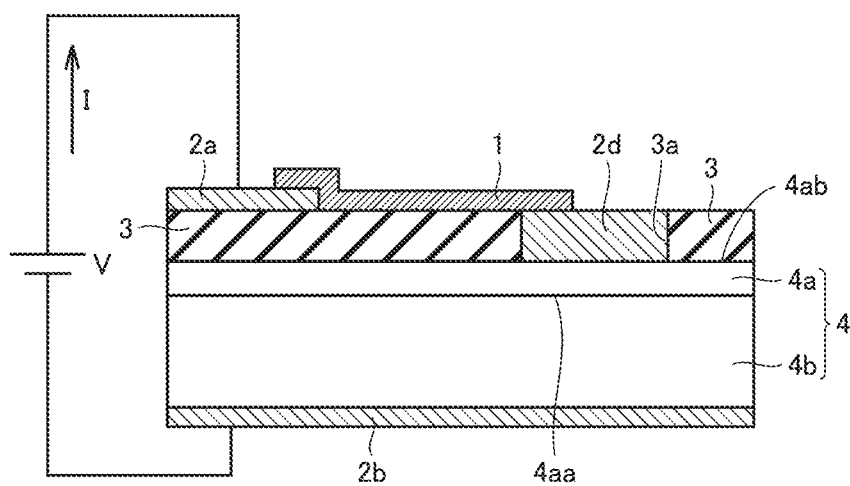
FIG. 9 is a cross-sectional view of the electromagnetic wave detector according to a fourth embodiment.

FIG. 9 is a cross-sectional view of the electromagnetic wave detector according to a fourth embodiment. FIG. 9 corresponds to FIG. 2.

The electromagnetic wave detector shown in FIG. 9 basically has a configuration similar to the electromagnetic wave detector shown in FIG. 1 and FIG. 2 and can achieve a similar effect but differs from the electromagnetic wave detector shown in FIG. 1 and FIG. 2 in configuration of a connection portion between two-dimensional material layer 1 and light-receiving element 4. More specifically, a connection conductor 2d is formed inside opening portion 3a of insulating film 3. The back surface of connection conductor 2d is electrically connected to the front surface of first semiconductor portion 4a of light-receiving element 4. A part of two-dimensional material layer 1 is disposed in an overlapping manner on the upper surface of connection conductor 2d. Two-dimensional material layer 1 is electrically connected to the upper surface of connection conductor 2d. The position of the upper surface of connection conductor 2d is substantially the same as the position of the upper surface of insulating film 3. Two-dimensional material layer 1 extends from the upper surface of insulating film 3 onto the upper surface of connection conductor 2d planarly without bending.

It is preferable that an ohmic contact is formed between connection conductor 2d and first semiconductor portion 4a. Furthermore, it is preferable that connection conductor 2d exhibits a high transmittance at wavelengths of electromagnetic waves detected by the electromagnetic wave detector.

Here, the configuration of the electromagnetic wave detector according to the present embodiment can be applied to other embodiments.

<Operation Effect>

The electromagnetic wave detector described above includes connection conductor 2d. Connection conductor 2d electrically connects light-receiving element 4 and two-dimensional material layer 1 in the inside of opening portion 3a. In this case, connection conductor 2d provided between two-dimensional material layer 1 and first semiconductor portion 4a can reduce contact resistance between two-dimensional material layer 1 and first semiconductor portion 4a. Furthermore, connection conductor 2d and first semiconductor portion 4a form a Schottky barrier, thereby reducing dark current.

It is preferable that the thickness of connection conductor 2d is substantially the same as the thickness of insulating film 3, that is, the position of the upper surface of connection conductor 2d is substantially the same as the position of the upper surface of insulating film 3. In this case, since two-dimensional material layer 1 is formed horizontally without bending, the mobility of carriers in two-dimensional material layer 1 is enhanced. Since the optical gate effect is proportional to the mobility, the sensitivity of the electromagnetic wave detector is enhanced Fifth Embodiment <Configuration of Electromagnetic Wave Detector>

Figure 10:
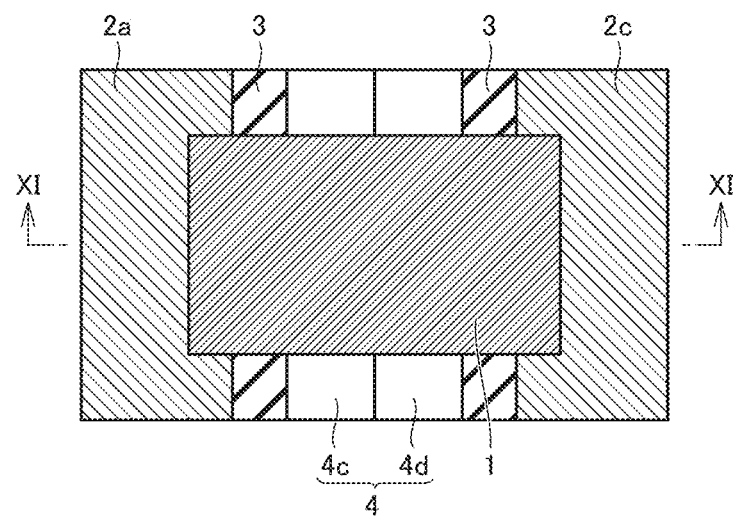
FIG. 10 is a plan view of the electromagnetic wave detector according to a fifth embodiment.
Figure 11:
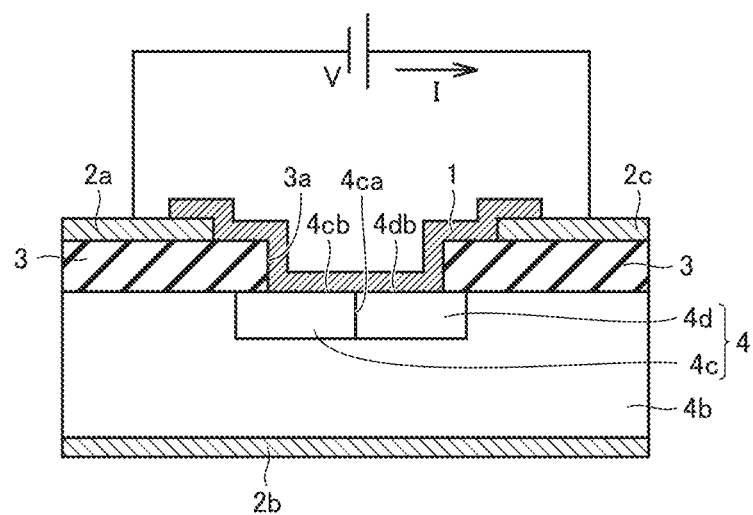
FIG. 11 is a cross-sectional view along line XI-XI in FIG. 10.
Figure 12:
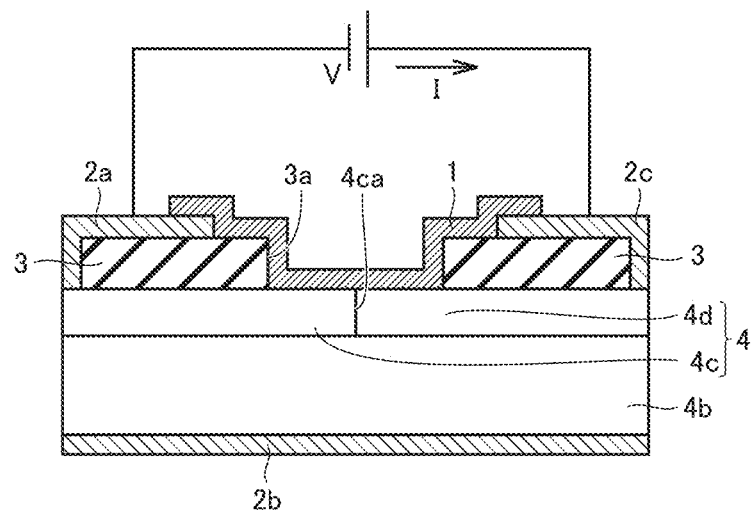
FIG. 12 is a cross-sectional view of a modification of the electromagnetic wave detector according to the fifth embodiment.

FIG. 10 is a plan view of the electromagnetic wave detector according to a fifth embodiment. FIG. 11 is a cross-sectional view along line XI-XI in FIG. 10. FIG. 12 is a cross-sectional view of a modification of the electromagnetic wave detector according to the fifth embodiment. FIG. 11 and FIG. 12 correspond to FIG. 2.

The electromagnetic wave detector shown in FIG. 10 and FIG. 11 basically has a configuration similar to the electromagnetic wave detector shown in FIG. 1 and FIG. 2 and can achieve a similar effect but differs from the electromagnetic wave detector shown in FIG. 1 and FIG. 2 in configuration of light-receiving element 4 and two-dimensional material layer 1. More specifically, in the electromagnetic wave detector shown in FIG. 10 and FIG. 11, light-receiving element 4 is formed such that a third semiconductor portion 4c and a fourth semiconductor portion 4d are joined in the horizontal direction. Fourth semiconductor portion 4d is doped with a carrier opposite to that of third semiconductor portion 4c. Furthermore, two-dimensional material layer 1 extends from the inside of opening portion 3a onto a portion of insulating film 3 on the side opposite to the side where first electrode part 2a is positioned, as viewed from opening portion 3a of insulating film 3. Another electrode part 2c is formed on a portion of insulating film 3 on the side opposite to the side where first electrode part 2a is positioned, as viewed from opening portion 3a. Two-dimensional material layer 1 is electrically connected to electrode part 2c. A voltage V is applied between first electrode part 2a and electrode part 2c.

As shown in FIG. 11, junction portion 4ca that is the junction interface of light-receiving element 4 is positioned under opening portion 3a of insulating film 3. Junction portion 4ca is disposed in contact with two-dimensional material layer 1. Therefore, the optical carriers produced by light radiation at junction portion 4ca that is the pn junction interface between third semiconductor portion 4c and fourth semiconductor portion 4d can be easily extracted from two-dimensional material layer 1. Further, two-dimensional material layer 1 on junction portion 4ca that is a pn junction interface is affected by local electric field change at the pn junction produced by optical carriers, so that the conductivity of two-dimensional material layer 1 is changed. As a result, higher sensitivity of the electromagnetic wave detector can be achieved.

Furthermore, as shown in FIG. 11, another electrode part 2c is formed in addition to first electrode part 2a. Further, two-dimensional material layer 1 is disposed to connect these electrode parts, that is, first electrode part 2a and electrode part 2c. Two-dimensional material layer 1 is connected to light-receiving element 4 at a region between first electrode part 2a and electrode part 2c. As a result, the optical carriers produced in light-receiving element 4 can be read with two-dimensional material layer 1 by applying a voltage between first electrode part 2a and electrode part 2c. In this case, the regions of two-dimensional material layer 1 in contact with third semiconductor portion 4c and fourth semiconductor portion 4d are doped with respective semiconductor materials. Thus, a gradient of charge density is formed in two-dimensional material layer 1. As a result, the mobility of carriers in two-dimensional material layer 1 is enhanced, and higher sensitivity of the electromagnetic wave detector can be achieved.

The electromagnetic wave detector shown in FIG. 12 basically has a configuration similar to the electromagnetic wave detector shown in FIG. 10 and FIG. 11 and can achieve a similar effect but differs from the electromagnetic wave detector shown in FIG. 10 and FIG. 11 in configuration of light-receiving element 4, insulating film 3, and first electrode part 2a and electrode part 2c. More specifically, in the electromagnetic wave detector shown in FIG. 12, first electrode part 2a is in contact with third semiconductor portion 4c. Further, electrode part 2c is in contact with fourth semiconductor portion 4d. Third semiconductor portion 4c extends from under opening portion 3a to a region positioned under first electrode part 2a. Fourth semiconductor portion 4d extends from under opening portion 3a to a region positioned under electrode part 2c. In insulating film 3, additional opening portions are formed at regions under first electrode part 2a and electrode part 2c at positions sandwiching opening portion 3a. First electrode part 2a and electrode part 2c extend in the inside of the respective additional opening portions. In the inside of the additional opening portions, first electrode part 2a is connected to third semiconductor portion 4c, and electrode part 2c is connected to fourth semiconductor portion 4d.

Thus, a voltage can be applied even to two-dimensional material layer 1 while a voltage V is applied between third semiconductor portion 4c and fourth semiconductor portion 4d. In this case, if light-receiving element 4 that is a photodiode including third semiconductor portion 4c and fourth semiconductor portion 4d is saturated with application of reverse bias, current flows only through two-dimensional material layer 1. Thus, a depletion layer is produced in third semiconductor portion 4c and fourth semiconductor portion 4d, and a large voltage change can be applied to two-dimensional material layer 1. Consequently, a large photocurrent (optical carriers) can be extracted. Further, in two-dimensional material layer 1, the conductivity of two-dimensional material layer 1 is changed under the influence of local electric field change that occurs in junction portion 4ca that is the pn junction interface between third semiconductor portion 4c and fourth semiconductor portion 4d. As a result, higher sensitivity of the electromagnetic wave detector can be achieved.

Furthermore, when a tunnel diode is used as light-receiving element 4 including third semiconductor portion 4c and fourth semiconductor portion 4d, a large photocurrent is produced only at the time of light radiation. The photocurrent is injected into two-dimensional material layer 1. Further, change in conductivity can be produced by the influence of electric field change in two-dimensional material layer 1 only at the time of light radiation. As a result, higher sensitivity of the electromagnetic wave detector can be achieved. In the configuration described above, second semiconductor portion 4b and second electrode part 2b may be formed but they are not necessarily formed.

Here, the configuration of the electromagnetic wave detector according to the present embodiment can be applied to other embodiments.

<Operation Effect>

In the electromagnetic wave detector described above, light-receiving element 4 includes third semiconductor portion 4c and fourth semiconductor portion 4d. Third semiconductor portion 4c has a first conductivity type. Fourth semiconductor portion 4d is joined to third semiconductor portion 4c. Fourth semiconductor portion 4d has a second conductivity type different from the first conductivity type. At the bottom of opening portion 3c, a part of junction portion 4ca between third semiconductor portion 4c and fourth semiconductor portion 4d, and a part of third semiconductor portion 4c and a part of fourth semiconductor portion 4d continuous to junction portion 4ca are disposed to face two-dimensional material layer 1.

In this case, the optical carriers produced by light radiation at junction portion 4ca that is the pn junction interface between third semiconductor portion 4c and fourth semiconductor portion 4d can be easily extracted from two-dimensional material layer 1 positioned inside opening portion 3a. Furthermore, two-dimensional material layer 1 on junction portion 4ca that is a pn junction interface is affected by local electric field change at the pn junction produced by optical carriers, so that the conductivity of two-dimensional material layer 1 is changed. As a result, higher sensitivity of the electromagnetic wave detector can be achieved.

In the electromagnetic wave detector, light-receiving element 4 is a tunnel diode. In this case, a large photocurrent is produced only at the time of light radiation in light-receiving element 4. The photocurrent is injected into two-dimensional material layer 1. Further, change in conductivity can be produced in two-dimensional material layer 1 only at the time of light radiation. As a result, higher sensitivity of the electromagnetic wave detector can be achieved.

Sixth Embodiment

<Configuration of Electromagnetic Wave Detector>

Figure 13:
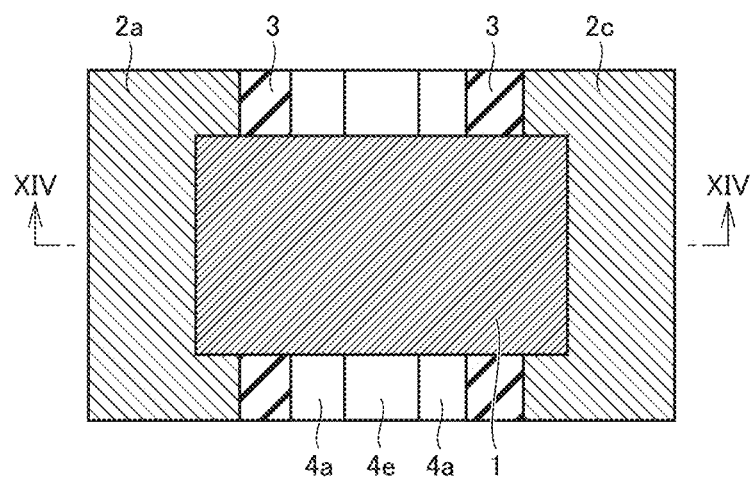
FIG. 13 is a plan view of the electromagnetic wave detector according to a sixth embodiment.
Figure 14:
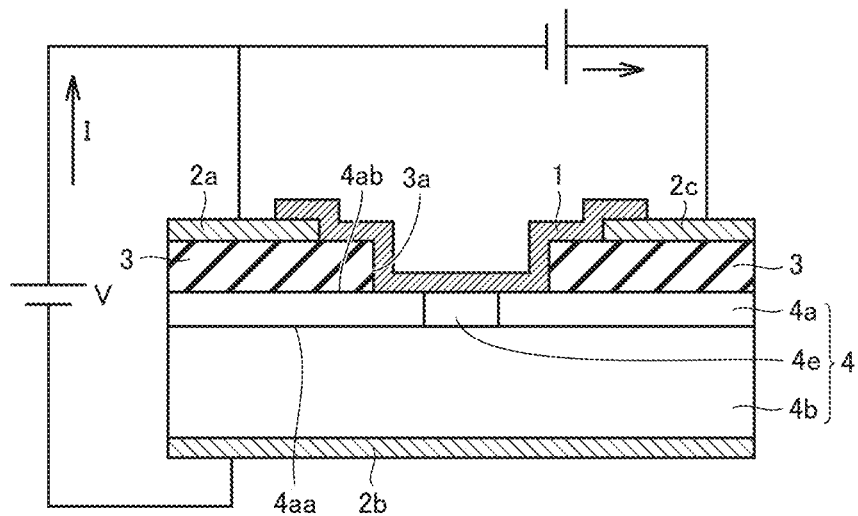
FIG. 14 is a cross-sectional view along line XIV-XIV in FIG. 13.
Figure 15:
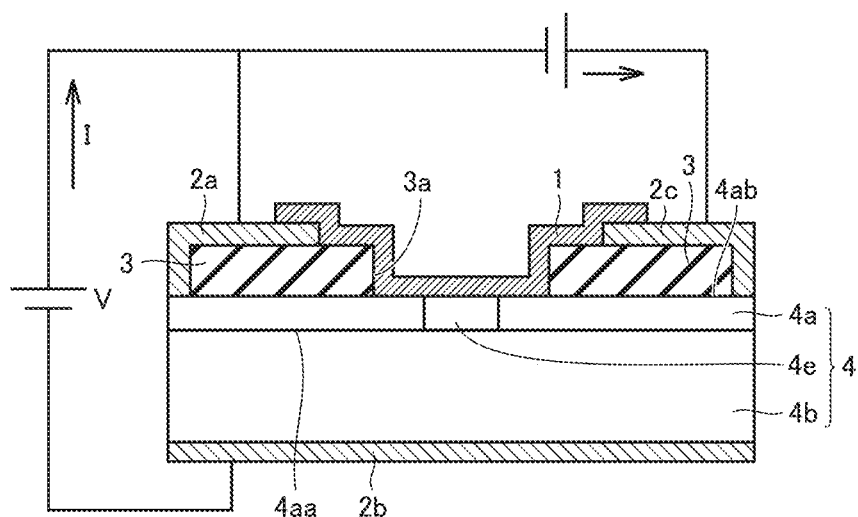
FIG. 15 is a cross-sectional view of a first modification of the electromagnetic wave detector according to the sixth embodiment.
Figure 16:
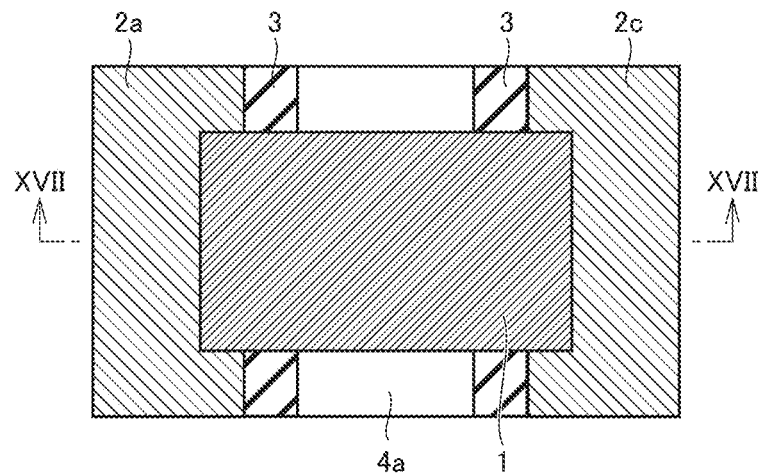
FIG. 16 is a plan view of a second modification of the electromagnetic wave detector according to the sixth embodiment.
Figure 17:
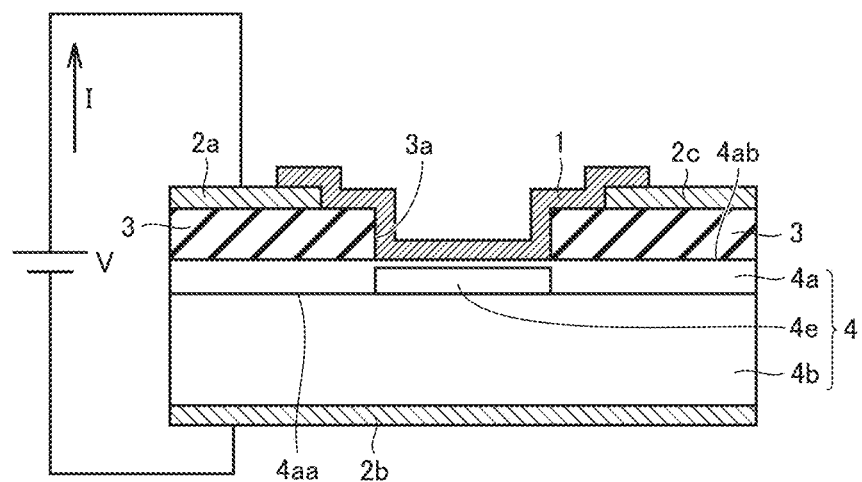
FIG. 17 is a cross-sectional view along line XVII-XVII in FIG. 16.

FIG. 13 is a plan view of the electromagnetic wave detector according to a sixth embodiment. FIG. 14 is a cross-sectional view along line XIV-XIV in FIG. 13. FIG. 15 is a cross-sectional view of a first modification of the electromagnetic wave detector according to the sixth embodiment. FIG. 16 is a plan view of a second modification of the electromagnetic wave detector according to the sixth embodiment. FIG. 17 is a cross-sectional view along line XVII-XVII in FIG. 16.

The electromagnetic wave detector shown in FIG. 13 and FIG. 14 basically has a configuration similar to the electromagnetic wave detector shown in FIG. 1 and FIG. 2 and can achieve a similar effect but differs from the electromagnetic wave detector shown in FIG. 1 and FIG. 2 in configuration of light-receiving element 4, two-dimensional material layer 1, first electrode part 2a, and electrode part 2c. More specifically, in the electromagnetic wave detector shown in FIG. 13 and FIG. 14, a fifth semiconductor portion 4e is formed at a region positioned under opening portion 3a in first semiconductor portion 4a of light-receiving element 4. Fifth semiconductor portion 4e is doped with a carrier of a conductivity type different from the conductivity type of first semiconductor portion 4a. That is, when first semiconductor portion 4a is of a first conductivity type, fifth semiconductor portion 4e is of a second conductivity type. Two-dimensional material layer 1 is connected to a region adjacent to fifth semiconductor portion 4e in fifth semiconductor portion 4e and first semiconductor portion 4a in the inside of opening portion 3a. Furthermore, two-dimensional material layer 1 extends from the inside of opening portion 3a onto a portion of insulating film 3 on the side opposite to the side where first electrode part 2a is positioned, as viewed from opening portion 3a of insulating film 3. Another electrode part 2c is formed on a portion of insulating film 3 on the side opposite to the side where first electrode part 2a is positioned, as viewed from opening portion 3a. Two-dimensional material layer 1 is electrically connected to electrode part 2c. A voltage V is applied between first electrode part 2a and second electrode part 2b.

Here, a plurality of fifth semiconductor portions 4e may be provided. More specifically, in the inside of opening portion 3a, a plurality of fifth semiconductor portions 4e may be spaced apart from each other in first semiconductor portion 4a. As a result, the number of pn junction interfaces between first semiconductor portion 4a and fifth semiconductor portion 4e can be increased. Further, the contact area between the pn junction interface and two-dimensional material layer 1 is increased, so that the effect that the local electric field change produced at the pn junction interface by light radiation has on two-dimensional material layer 1 can be increased.

Furthermore, first semiconductor portion 4a and fifth semiconductor portion 4e can form a pnp or npn phototransistor. For example, as shown in FIG. 15, first electrode part 2a may be in contact with first semiconductor portion 4a in the same manner as in the fifth embodiment. The electromagnetic wave detector shown in FIG. 15 basically has a configuration similar to the electromagnetic wave detector shown in FIG. 13 and FIG. 14 and can achieve a similar effect but differs from the electromagnetic wave detector shown in FIG. 13 and FIG. 14 in configuration of insulating film 3, first electrode part 2a, and electrode part 2c. More specifically, in the electromagnetic wave detector shown in FIG. 15, first electrode part 2a is in contact with first semiconductor portion 4a. Further, electrode part 2c is also in contact with first semiconductor portion 4a. In insulating film 3, additional opening portions are formed in regions positioned under first electrode part 2a and electrode part 2c at positions sandwiching opening portion 3a. First electrode part 2a and electrode part 2c extend in the inside of the respective additional opening portions. In the inside of the additional opening portions, first electrode part 2a and electrode part 2c are connected to first semiconductor portion 4a.

With such a configuration, current flows through the transistor formed with first semiconductor portion 4a and fifth semiconductor portion 4e only at the time of light radiation. As a result, electric field change can be produced in two-dimensional material layer 1, and higher sensitivity of the electromagnetic wave detector can be achieved additionally by the optical gate effect produced by optical carriers at the junction interface between first semiconductor portion 4a and second semiconductor portion 4b.

The electromagnetic wave detector shown in FIG. 16 and FIG. 17 basically has a configuration similar to the electromagnetic wave detector shown in FIG. 13 and FIG. 14 and can achieve a similar effect but differs from the electromagnetic wave detector shown in FIG. 13 and FIG. 14 in configuration of light-receiving element 4. More specifically, in the electromagnetic wave detector shown in FIG. 16 and FIG. 17, fifth semiconductor portion 4e doped with a carrier opposite to that of first semiconductor portion 4a is buried in first semiconductor portion 4a, in opening portion 3a of insulating film 3. Specifically, thin first semiconductor portion 4a is disposed between two-dimensional material layer 1 and fifth semiconductor portion 4e. The surface on the side opposite to the side facing two-dimensional material layer 1 in fifth semiconductor portion 4e is in contact with second semiconductor portion 4b. First semiconductor portion 4a and fifth semiconductor portion 4e form a pn junction. As a result, the pn junction is formed immediately below two-dimensional material layer 1 positioned inside opening portion 3a. Thus, the efficiency of extracting photocurrent from light-receiving element 4 to two-dimensional material layer 1 is enhanced. Further, since the electric field change applied by light-receiving element 4 to two-dimensional material layer 1 increases, higher sensitivity of the electromagnetic wave detector can be achieved. In the electromagnetic wave detector shown in FIG. 13 to FIG. 17 above, a voltage V may be applied between first electrode part 2a and electrode part 2c in the same manner as in the electromagnetic wave detector shown in FIG. 12. In the configuration described above, second semiconductor portion 4b and second electrode part 2b may be formed but they are not necessarily formed.

Here, the configuration of the electromagnetic wave detector according to the present embodiment can be applied to other embodiments.

<Operation Effect>

In the electromagnetic wave detector described above, light-receiving element 4 includes first semiconductor portion 4a and second semiconductor portion 4b. First semiconductor portion 4a has a first conductivity type. Second semiconductor portion 4b is joined to the first semiconductor portion. Second semiconductor portion 4b has a second conductivity type different from the first conductivity type. Insulating film 3 is formed on front surface 4ab positioned on the side opposite to junction portion 4aa joined to second semiconductor portion 4b in first semiconductor portion 4a. Light-receiving element 4 further includes fifth semiconductor portion 4e. As shown in FIG. 14 and FIG. 15, fifth semiconductor portion 4e may be disposed to penetrate from front surface 4ab of first semiconductor portion 4a to the surface on the side closer to second semiconductor portion 4b at the bottom portion of opening portion 3a. Fifth semiconductor portion 4e has the second conductivity type. As shown in FIG. 17, fifth semiconductor portion 4e may be provided on junction portion 4aa at the bottom portion of opening portion 3a. First semiconductor portion 4a may be formed on fifth semiconductor portion 4e.

In this way, as shown in FIG. 17, pn junctions are respectively formed at the junction interface between first semiconductor portion 4a and fifth semiconductor portion 4e and the junction interface between first semiconductor portion 4a and second semiconductor portion 4b to form a diode. The diode is irradiated with electromagnetic waves (light), so that the optical carriers produced at the junction interface between first semiconductor portion 4a and fifth semiconductor portion 4e are less deactivated, and photocurrent injected into two-dimensional material layer 1 is increased. Furthermore, the optical carriers produced at the junction interface between first semiconductor portion 4a and second semiconductor portion 4b produce the optical gate effect, thereby producing electric field change in two-dimensional material layer 1. As a result, an electromagnetic wave detector with high sensitivity can be obtained.

Seventh Embodiment

<Configuration of Electromagnetic Wave Detector>

Figure 18:
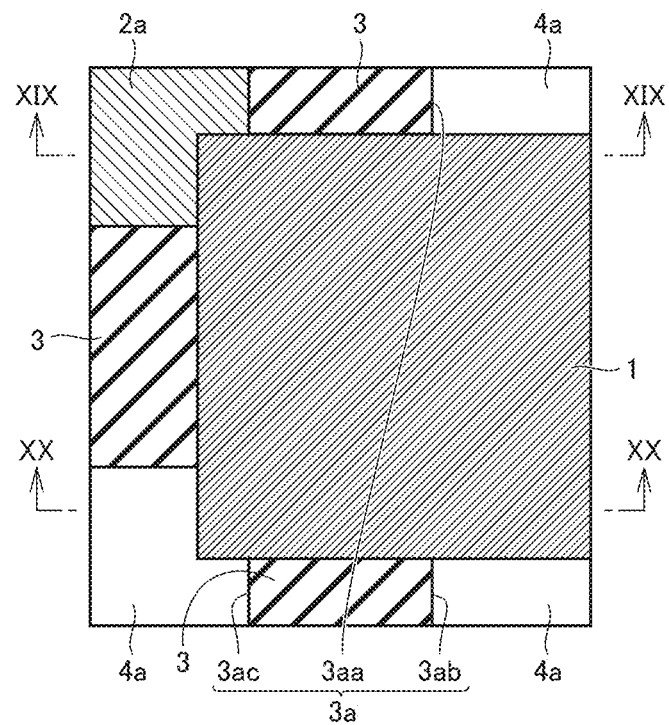
FIG. 18 is a plan view of the electromagnetic wave detector according to a seventh embodiment.
Figure 19:
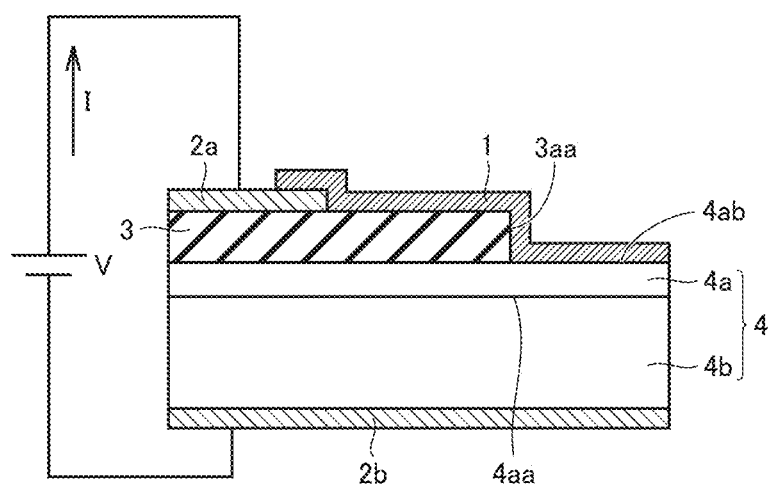
FIG. 19 is a cross-sectional view along line XIX-XIX in FIG. 18.
Figure 20:
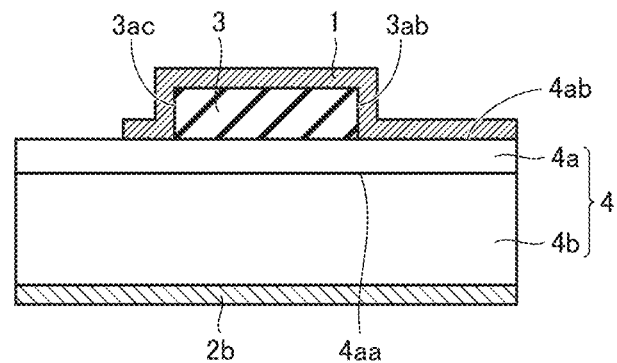
FIG. 20 is a cross-sectional view along line XX-XX in FIG. 18.
Figure 21:
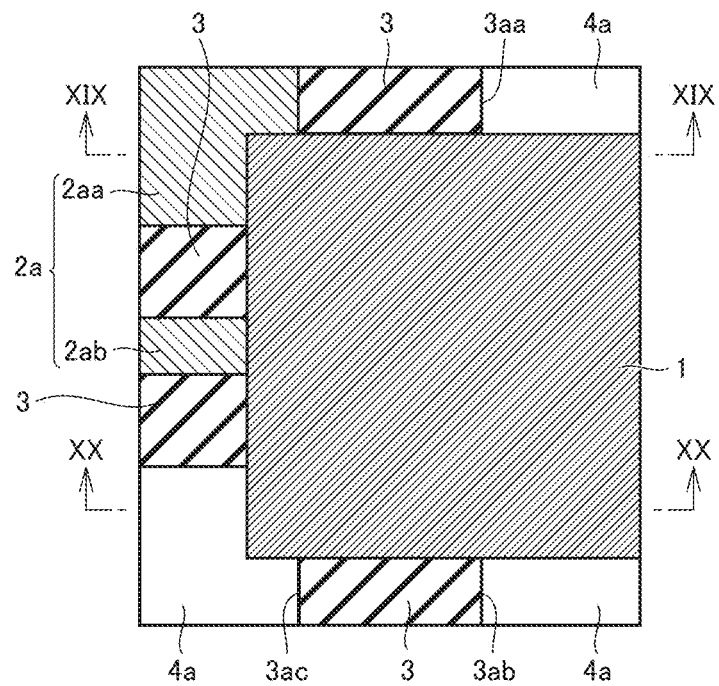
FIG. 21 is a plan view of a first modification of the electromagnetic wave detector according to the seventh embodiment.
Figure 22:
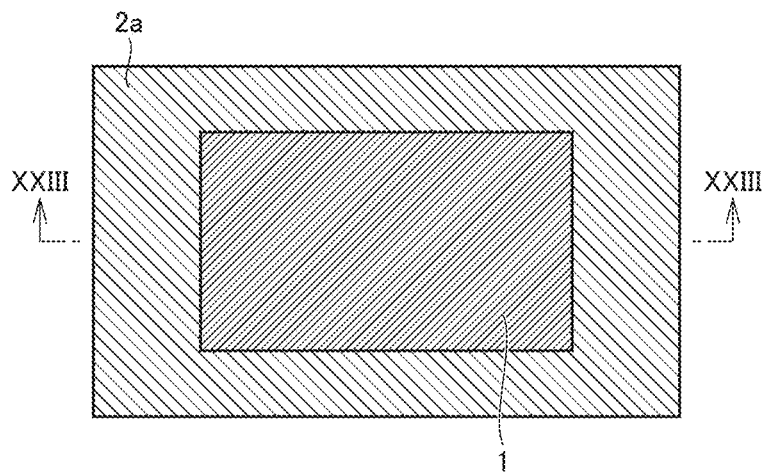
FIG. 22 is a plan view of a second modification of the electromagnetic wave detector according to the seventh embodiment.
Figure 23:
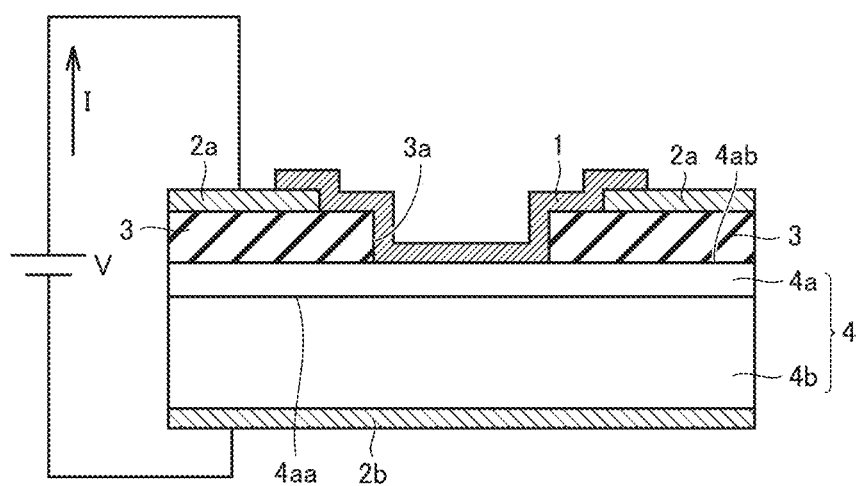
FIG. 23 is a cross-sectional view along line XXIII-XXIII in FIG. 22.
Figure 24:
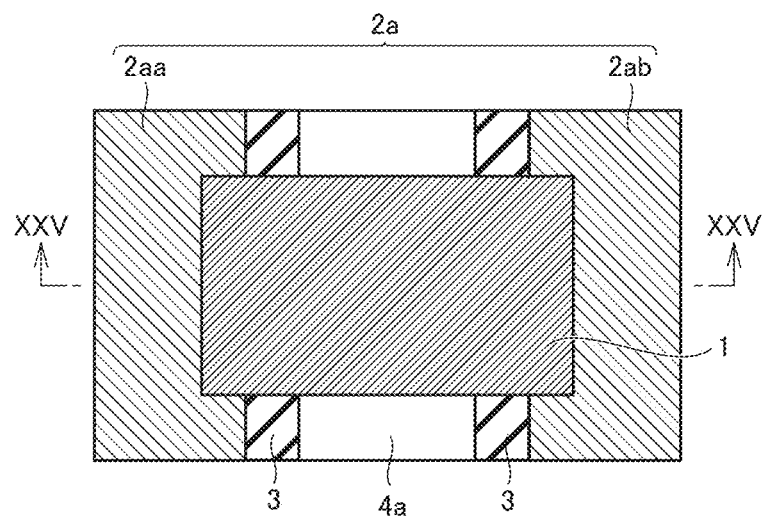
FIG. 24 is a plan view of a third modification of the electromagnetic wave detector according to the seventh embodiment.
Figure 25:
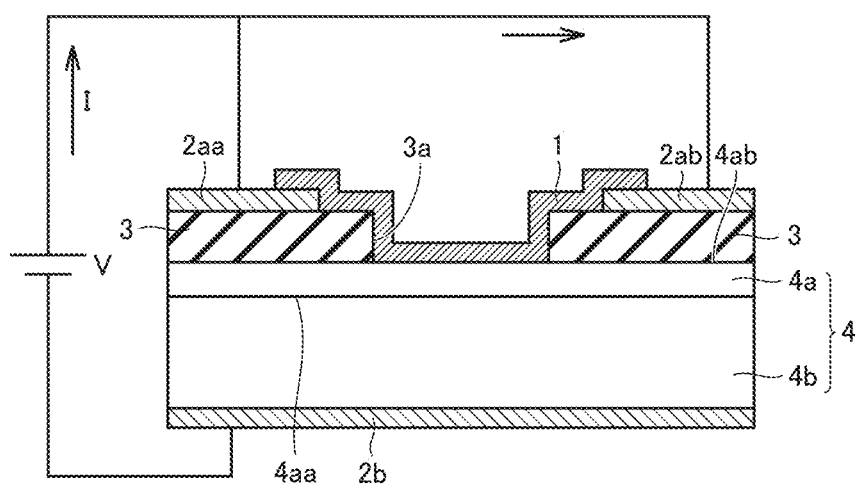
FIG. 25 is a cross-sectional view along line XXV-XXV in FIG. 24.

FIG. 18 is a plan view of the electromagnetic wave detector according to a seventh embodiment. FIG. 19 is a cross-sectional view along line XIX-XIX in FIG. 18. FIG. 20 is a cross-sectional view along line XX-XX in FIG. 18. FIG. 21 is a plan view of a first modification of the electromagnetic wave detector according to the seventh embodiment. FIG. 22 is a plan view of a second modification of the electromagnetic wave detector according to the seventh embodiment. FIG. 23 is a cross-sectional view along line XXIII-XXIII in FIG. 22. FIG. 24 is a plan view of a third modification of the electromagnetic wave detector according to the seventh embodiment. FIG. 25 is a cross-sectional view along line XXV-XXV in FIG. 24.

The electromagnetic wave detector shown in FIG. 18 to FIG. 20 basically has a configuration similar to the electromagnetic wave detector shown in FIG. 1 and FIG. 2 and can achieve a similar effect but differs from the electromagnetic wave detector shown in FIG. 1 and FIG. 2 in configuration of two-dimensional material layer 1 and insulating film 3. More specifically, the electromagnetic wave detector shown in FIG. 18 to FIG. 20 differs from the electromagnetic wave detector shown in FIG. 1 and FIG. 2 in that a plurality of opening portions are formed as opening portions 3a in insulating film 3 and in that two-dimensional material layer 1 extends to the inside of the opening portions, and light-receiving element 4 and two-dimensional material layer 1 are connected in the inside of the opening portions. Specifically, in the electromagnetic wave detector shown in FIG. 18 to FIG. 20, a first opening 3aa, a second opening 3ab, and a third opening 3ac are formed as a plurality of opening portions 3a in insulating film 3. First opening 3aa, second opening 3ab, and third opening 3ac are spaced apart from each other. First opening 3aa, second opening 3ab, and third opening 3ac each penetrate insulating film 3 and expose the front surface of first semiconductor portion 4a of light-receiving element 4 at the bottom portion. Two-dimensional material layer 1 extends from on the surface of the upper portion of insulating film 3 to the inside of first opening 3aa, second opening 3ab, and third opening 3ac. Two-dimensional material layer 1 is in contact with first semiconductor portion 4a at the bottom of first opening 3aa, second opening 3ab, and third opening 3ac.

As described above, a plurality of openings are provided in insulating film 3 to increase the contact area between two-dimensional material layer 1 and first semiconductor portion 4a, so that current flowing from light-receiving element 4 to two-dimensional material layer 1 can be distributed. Therefore, the region where two-dimensional material layer 1 is affected by the electric field change from light-receiving element 4 through insulating film 3 can be expanded.

For example, the electromagnetic wave detector employing the present embodiment is considered as a pixel. For example, the electromagnetic wave detector shown in FIG. 18 is considered as a pixel having a quadrangular planar shape. In order to reduce attenuation of electromagnetic waves incident on light-receiving element 4 including first semiconductor portion 4a and second semiconductor portion 4b, it is preferable that the area of first electrode part 2a is minimized. Therefore, as shown in FIG. 18, first electrode part 2a is disposed at one of four corners of the pixel. First opening 3aa, second opening 3ab, and third opening 3ac are provided at the other corners. This configuration can minimize attenuation of electromagnetic waves due to first electrode part 2a while increasing the contact area between two-dimensional material layer 1 and insulating film 3. As a result, the region affected by the electric field change from light-receiving element 4 can be expanded in two-dimensional material layer 1, and higher sensitivity of the electromagnetic wave detector can be achieved. The area of first electrode part 2a and opening portion 3a of insulating film 3 is preferably as small as possible.

The electromagnetic wave detector shown in FIG. 21 basically has a configuration similar to the electromagnetic wave detector shown in FIG. 18 to FIG. 20 and can achieve a similar effect but differs from the electromagnetic wave detector shown in FIG. 18 to FIG. 20 in configuration of the electrode parts. More specifically, in the electromagnetic wave detector shown in FIG. 21, a first electrode 2aa and a second electrode 2ab are formed as a plurality of first electrode parts 2a on the surface of the upper portion of insulating film 3. First electrode 2aa and second electrode 2ab are spaced apart from each other. Two-dimensional material layer 1 is connected to first electrode 2aa and second electrode 2ab. As shown in FIG. 21, second electrode 2ab is disposed between first electrode 2aa and third opening 3ac in a plan view. The arrangement of second electrode 2ab is not limited to the position shown in FIG. 21, and second electrode 2ab may be disposed at a different position on insulating film 3. For example, second electrode 2ab may be disposed between first electrode 2aa and first opening 3aa, may be disposed between second opening 3ab and third opening 3ac, or may be disposed between first opening 3aa and second opening 3ab.

The electromagnetic wave detector shown in FIG. 22 and FIG. 23 basically has a configuration similar to the electromagnetic wave detector shown in FIG. 18 to FIG. 20 and can achieve a similar effect but differs from the electromagnetic wave detector shown in FIG. 18 to FIG. 20 in configuration of first electrode part 2a and insulating film 3. More specifically, in the electromagnetic wave detector shown in FIG. 22 and FIG. 23, first electrode part 2a is disposed to cover the outer periphery of the pixel. Opening 3a of insulating film 3 is disposed at the center of the pixel. First electrode part 2a is formed on the surface of the upper portion of insulating film 3 so as to surround the outer periphery of opening portion 3a of insulating film 3. In this case, since photocurrent extracted from light-receiving element 4 through two-dimensional material layer 1 increases, higher sensitivity of the electromagnetic wave detector can be achieved. It is preferable that the width of first electrode part 2a is as narrow as possible in order to suppress attenuation of electromagnetic waves.

The electromagnetic wave detector shown in FIG. 24 and FIG. 25 basically has a configuration similar to the electromagnetic wave detector shown in FIG. 18 to FIG. 20 and can achieve a similar effect but differs from the electromagnetic wave detector shown in FIG. 18 to FIG. 20 in configuration of first electrode part 2a and insulating film 3. More specifically, in the electromagnetic wave detector shown in FIG. 24 and FIG. 25, first electrode 2aa and second electrode 2ab are disposed as first electrode part 2a on the outer periphery of the pixel. First electrode 2*aa* is disposed on one end along one side of the outer periphery of the pixel. Second electrode 2*ab* is disposed on the other end along the other side opposed to the one side of the outer periphery of the pixel. Opening portion 3*a* of insulating film 3 is formed at a region between first electrode 2*aa* and second electrode 2*ab*. Opening portion 3*a* extends along the extending direction of first electrode 2*aa* and second electrode 2*ab*. Opening portion 3*a* is formed to reach a pair of sides that connect the one side and the other side of the outer periphery of the pixel. When insulating film 3 does not block electromagnetic waves, opening portion 3*a* may have any shape. In this case, photocurrent extracted from light-receiving element 4 can be increased while attenuation of electromagnetic waves due to first electrode part 2*a* is suppressed. Thus, higher sensitivity of the electromagnetic wave detector can be achieved.

A plurality of electrodes serving as first electrode part 2*a* may be disposed at any location in the front surface of insulating film 3 of the pixel. For example, a plurality of electrodes may be respectively disposed at four corners of the pixel. Furthermore, insulating film 3 may have two or more opening portions 3*a*.

Here, the configuration of the electromagnetic wave detector according to the present embodiment can be applied to other embodiments.

<Operation Effect>

In the electromagnetic wave detector described above, as shown in FIG. 18 and FIG. 21, opening portion 3*a* includes first opening 3*aa* and second opening 3*ab*. First opening 3*aa* is formed in insulating film 3. Second opening 3*ab* is formed at a position different from that of first opening 3*aa*. Two-dimensional material layer 1 extends from on insulating film 3 to the inside of first opening 3*aa* and second opening 3*ab*. Two-dimensional material layer 1 is configured such that photocurrent can be input from light-receiving element 4 in the inside of first opening 3*aa* and second opening 3*ab*. Two-dimensional material layer 1 may be in contact with light-receiving element 4 in the inside of first opening 3*aa* and second opening 3*ab*.

In this case, the contact region between two-dimensional material layer 1 and light-receiving element 4 is increased, so that current flowing from light-receiving element 4 to two-dimensional material layer 1 can be distributed. Therefore, the region where two-dimensional material layer 1 is affected by the electric field change from light-receiving element 4 through insulating film 3 can be expanded. As a result, higher sensitivity of the electromagnetic wave detector can be achieved.

In the electromagnetic wave detector described above, as shown in FIG. 21 and FIG. 24, first electrode part 2*a* includes first electrode 2*aa* and second electrode 2*ab*. First electrode 2*aa* is disposed on insulating film 3. Second electrode 2*ab* is disposed at a position different from that of first electrode 2*aa*. In this case, a plurality of connection portions between two-dimensional material layer 1 and first electrode part 2*a* can be formed.

In the electromagnetic wave detector described above, light-receiving element 4 has a quadrangular planar shape. In a planar view of light-receiving element 4, opening portion 3*a* and first electrode part 2*a* are disposed at the corners in the planar shape of light-receiving element 4. Two-dimensional material layer 1 may be disposed at a region partially overlapping with opening portion 3*a* and first electrode part 2*a* and substantially overlapping with the planar shape of light-receiving element 4. In this case, the region affected by the electric field change from light-receiving element 4 in two-dimensional material layer 1 can be expanded while attenuation of electromagnetic waves due to first electrode part 2*a* is minimized. As a result, higher sensitivity of the electromagnetic wave detector can be achieved.

Eighth Embodiment

<Configuration of Electromagnetic Wave Detector>

Figure 26:
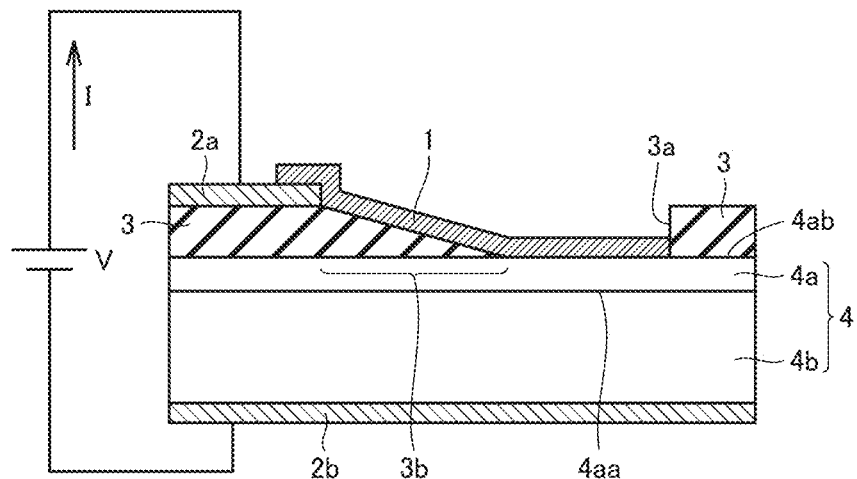
FIG. 26 is a cross-sectional view of the electromagnetic wave detector according to an eighth embodiment.

FIG. 26 is a cross-sectional view of the electromagnetic wave detector according to an eighth embodiment. The electromagnetic wave detector shown in FIG. 26 basically has a configuration similar to the electromagnetic wave detector shown in FIG. 1 and FIG. 2 and can achieve a similar effect but differs from the electromagnetic wave detector shown in FIG. 1 and FIG. 2 in configuration of two-dimensional material layer 1 and insulating film 3. More specifically, the electromagnetic wave detector shown in FIG. 26 differs from the electromagnetic wave detector shown in FIG. 1 and FIG. 2 in that insulating film 3 has a tapered portion 3*b* in which the thickness of insulating film 3 gradually decreases from first electrode part 2*a* toward opening portion 3*a*.

As shown in FIG. 26, tapered portion 3*b* having the inclined surface of insulating film 3 relative to front surface 4*ab* of first semiconductor portion 4*a* is formed between first electrode part 2*a* and opening portion 3*a* of insulating film 3. The angle between the surface of tapered portion 3*b* and front surface 4*ab* of first semiconductor portion 4*a* is an acute angle, for example, 45° or smaller, or 30° or smaller. The surface of tapered portion 3*b* may be planar or may be curved. Tapered portion 3*b* may be formed by any method. For example, tapered portion 3*b* may be formed by forming an insulating film while tilting a semiconductor substrate having light-receiving element 4. Alternatively, tapered portion 3*b* may be formed by performing dry etching on insulating film 3 formed on the semiconductor substrate in advance while tilting the semiconductor substrate.

Since insulating film 3 has a slope at tapered portion 3*b*, local change occurs in degree of electric field change in two-dimensional material layer 1 when light-receiving element 4 is irradiated with electromagnetic waves. More specifically, when electromagnetic waves are applied to the pn junction in light-receiving element 4 including first semiconductor portion 4*a* and second semiconductor portion 4*b* to apply electric field change to two-dimensional material layer 1, the degree of the electric field change varies with variation in thickness of insulating film 3. Thus, the mobility of carriers in two-dimensional material layer 1 is enhanced, and higher sensitivity of electromagnetic wave detector can be achieved.

Here, the configuration of the electromagnetic wave detector according to the present embodiment can be applied to other embodiments.

<Operation Effect>

In the electromagnetic wave detector described above, insulating film 3 includes tapered portion 3*b*. Tapered portion 3*b* is a portion in which the thickness varies from opening portion 3*a* toward first electrode part 2*a*. More specifically, the thickness of tapered portion 3*b* increases from opening portion 3*a* toward first electrode part 2*a*. In this case, the degree of electric field change in two-dimensional material layer 1 produced when light-receiving element 4 is irradiated with electromagnetic waves can be locally changed in accordance with variation in thickness of insulating film 3 at tapered portion 3*b*. As a result, the mobility of carriers in two-dimensional material layer 1 is enhanced, and higher sensitivity of the electromagnetic wave detector can be achieved.

Ninth Embodiment

<Configuration of Electromagnetic Wave Detector>

Figure 27:
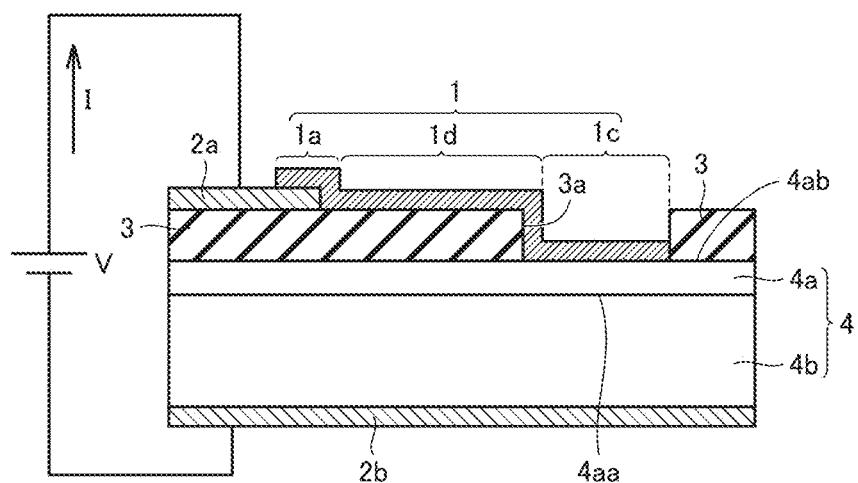
FIG. 27 is a cross-sectional view of the electromagnetic wave detector according to a ninth embodiment.

FIG. 27 is a cross-sectional view of the electromagnetic wave detector according to a ninth embodiment. The electromagnetic wave detector shown in FIG. 27 basically has a configuration similar to the electromagnetic wave detector shown in FIG. 1 and FIG. 2 and can achieve a similar effect but differs from the electromagnetic wave detector shown in FIG. 1 and FIG. 2 in configuration of two-dimensional material layer 1. More specifically, the electromagnetic wave detector shown in FIG. 27 differs from the electromagnetic wave detector shown in FIG. 1 and FIG. 2 in that two-dimensional material layer 1 includes a turbostratic structure portion 1d.

In the electromagnetic wave detector shown in FIG. 27, a region corresponding to the channel region in two-dimensional material layer 1 is turbostratic structure portion 1d. As used herein turbostratic structure portion 1d is a region having a stack of graphene layers and means a structure in which the lattices of stacked graphene are mismatched. The entire two-dimensional material layer 1 may be a turbostratic structure, or only the turbostratic structure portion 1d may be a turbostratic structure.

Any method can be used as a method of fabricating turbostratic structure portion 1d. For example, turbostratic structure portion 1d may be formed by transferring monolayer graphene fabricated by CVD multiple times to stack multilayer graphene. Alternatively, turbostratic structure portion 1d may be formed by growing graphene on graphene by CVD using ethanol or methane as a carbon source.

In the electromagnetic wave detector shown in FIG. 27, since the portion corresponding to the channel region in two-dimensional material layer 1 is turbostratic structure portion 1d, the mobility of carriers in two-dimensional material layer 1 is enhanced. Here, common multilayer graphene is called A-B stacking and stacked in a state in which the lattices of stacked graphene are matched. However, graphene fabricated by CVD is polycrystalline, and when graphene is further transferred multiple times on graphene, or when graphene is stacked on the underlying graphene by CVD, a turbostratic structure in which the lattices of stacked graphene are mismatched is formed.

Graphene having a turbostratic structure that forms turbostratic structure portion 1d is less affected by interaction between layers and has properties equivalent to monolayer graphene. Further, two-dimensional material layer 1 is affected by carrier scattering in the underlying insulating film 3 and the mobility is reduced. However, in turbostratic structure portion 1d, graphene in contact with insulating film 3 is affected by carrier scattering, but the overlying graphene stacked as a turbostratic structure on the graphene is less affected by carrier scattering in the underlying insulating film 3. Furthermore, since graphene with a turbostratic structure is less affected by interaction between layers, the conductivity is also enhanced. Based on the above, the mobility of carriers can be enhanced in graphene with a turbostratic structure. As a result, the sensitivity of the electromagnetic wave detector can be enhanced.

Furthermore, graphene with a turbostratic structure may be applied only to a portion of two-dimensional material layer 1 lying on insulating film 3. For example, graphene that is not a turbostratic structure, for example, monolayer graphene may be used for region 1a in two-dimensional material layer 1. In this case, the influence of carrier scattering in insulating film 3 on two-dimensional material layer 1 can be suppressed without increasing the contact resistance between first electrode part 2a and first semiconductor portion 4a, and two-dimensional material layer 1.

Here, the configuration of the electromagnetic wave detector according to the present embodiment can be applied to other embodiments.

<Operation Effect>

In the electromagnetic wave detector described above, two-dimensional material layer 1 includes turbostratic structure portion 1d. In this case, the mobility of carriers in two-dimensional material layer 1 can be enhanced. As a result, the sensitivity of the electromagnetic wave detector can be enhanced.

Tenth Embodiment

<Configuration of Electromagnetic Wave Detector>

Figure 28:
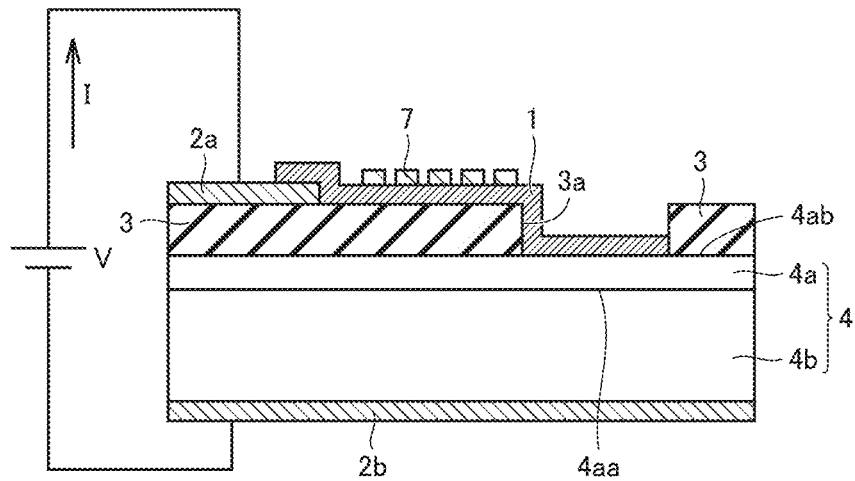
FIG. 28 is a cross-sectional view of the electromagnetic wave detector according to a tenth embodiment.
Figure 29:
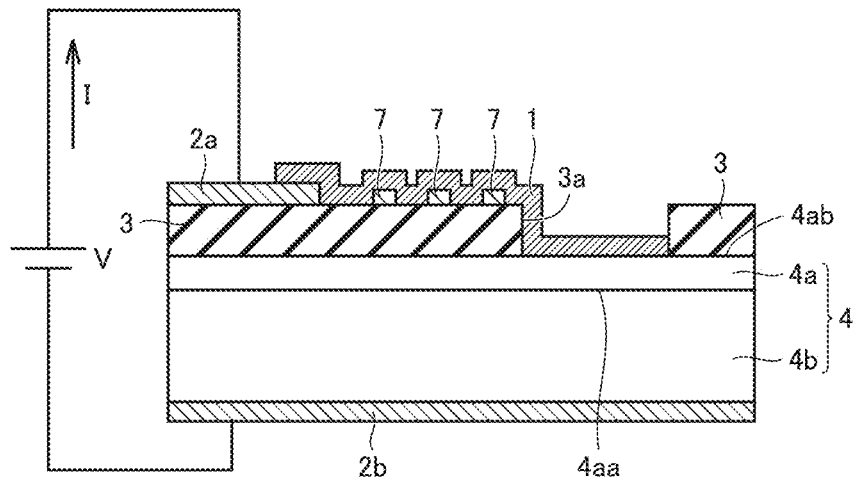
FIG. 29 is a cross-sectional view of a modification of the electromagnetic wave detector according to the tenth embodiment.

FIG. 28 is a cross-sectional view of the electromagnetic wave detector according to a tenth embodiment. FIG. 29 is a cross-sectional view of a modification of the electromagnetic wave detector according to the tenth embodiment.

The electromagnetic wave detector shown in FIG. 28 basically has a configuration similar to the electromagnetic wave detector shown in FIG. 1 and FIG. 2 and can achieve a similar effect but differs from the electromagnetic wave detector shown in FIG. 1 and FIG. 2 in the configuration on two-dimensional material layer 1. More specifically, the electromagnetic wave detector shown in FIG. 28 differs from the electromagnetic wave detector shown in FIG. 1 and FIG. 2 in that at least one or more conductors 7 are formed on a surface of the upper portion of two-dimensional material layer 1. A plurality of conductors 7 are disposed on the surface of the upper portion of two-dimensional material layer 1. Conductors 7 are spaced apart from each other. Conductors 7 are floating electrodes. This will be specifically described below.

As shown in FIG. 28, the electromagnetic wave detector according to the present embodiment includes conductors 7 as floating electrodes on two-dimensional material layer 1. Any material that is a conductor can be used as the material forming conductors 7. For example, a metal material such as gold (Au), silver (Ag), copper (Cu), aluminum (Al), nickel (Ni), chromium (Cr), or palladium (Pd) can be used as the material of conductors 7. Here, conductors 7 are not connected to a power supply circuit and are floated.

Conductors 7 are provided on two-dimensional material layer 1 positioned between first electrode part 2a and first semiconductor portion 4a. Conductors 7 have a one-dimensional or two-dimensional periodic structure. For example, as an example of the one-dimensional periodic structure, a structure in which a plurality of conductors 7 are arranged so as to be spaced apart from each other (periodically) in the horizontal direction on the drawing sheet or in the depth direction of the drawing sheet in FIG. 28 may be employed. As an example of the two-dimensional periodic structure, a structure in which conductors 7 are arranged at positions corresponding to lattice points of a square lattice or a triangular lattice in a planar view of the electromagnetic wave detector may be employed. In a planar view of the electromagnetic wave detector, the planar shape of each conductor 7 may be any shape such as circular, triangular, quadrangular, polygonal, or oval shape. The arrangement of conductors 7 in a planar view is not limited to the arrangement having periodic symmetry described above and may be a nonsymmetric arrangement in a planar view. Here, any method may be employed as a specific method of forming conductors 7. However, for example, a method similar to the method of manufacturing first electrode part 2a described in the first embodiment may be used.

In the electromagnetic wave detector according to the present embodiment, conductors 7 which are floating electrodes are provided on two-dimensional material layer 1 corresponding to the channel region. Therefore, the optical carriers produced by radiation of electromagnetic waves in light-receiving element 4 can move back and forth between a plurality of conductors 7, and consequently, the life of optical carriers is prolonged. Accordingly, the sensitivity of the electromagnetic wave detector can be increased.

When a plurality of conductors 7 are disposed to form a one-dimensional periodic structure and a material producing surface plasmon resonance is used as the material of conductors 7, polarization dependence occurs in conductors 7 with the applied electromagnetic waves. As a result, only electromagnetic waves having particular polarized light can be applied to light-receiving element 4 of the electromagnetic wave detector. In this case, the electromagnetic wave detector according to the present embodiment can be detect only particular polarized light.

When a plurality of conductors 7 are disposed to form a two-dimensional periodic structure and a material that produces surface plasmon resonance is used as the material of conductors 7, electromagnetic waves having particular wavelengths can resonate with conductors 7. In this case, the electromagnetic wave detector can detect only electromagnetic waves having particular wavelengths. In this case, the electromagnetic wave detector according to the present embodiment can detect only electromagnetic waves having particular wavelengths with high sensitivity.

When a plurality of conductors 7 are formed in asymmetric arrangement in a planar view, polarization dependence occurs in conductors 7 for the applied electromagnetic waves, in the same manner as when a plurality of conductors 7 are formed in a one-dimensional periodic structure. As a result, only electromagnetic waves having particular polarized light can be applied to light-receiving element 4. In this case, the electromagnetic wave detector according to the present embodiment can be detect only particular polarized light.

The electromagnetic wave detector shown in FIG. 29 basically has a configuration similar to the electromagnetic wave detector shown in FIG. 28 and can achieve a similar effect but differs from the electromagnetic wave detector shown in FIG. 28 in that conductors 7 are disposed under two-dimensional material layer 1. More specifically, in the electromagnetic wave detector shown in FIG. 29, a plurality of conductors 7 are disposed between the lower surface of two-dimensional material layer 1 and the surface of the upper portion of insulating film 3. Two-dimensional material layer 1 has a plurality of bent portions (projections and depressions) along the surfaces of conductors 7. Such a configuration can also achieve an effect similar to that of the electromagnetic wave detector shown in FIG. 28. Further, in this case, reduction in mobility of carriers in two-dimensional material layer 1 can be suppressed because two-dimensional material layer 1 is not damaged in forming conductors 7.

Projections and depressions may be formed in a region of two-dimensional material layer 1 corresponding to the channel region. In this case, the projections and depressions of two-dimensional material layer 1 may be a periodic structure or an asymmetric structure, in the same manner as a plurality of conductors 7 described above. In this case, an effect similar to the effect achieved when a plurality of conductors 7 are formed can be achieved.

Here, the configuration of the electromagnetic wave detector according to the present embodiment can be applied to other embodiments.

<Operation Effect>

The electromagnetic wave detector described above further includes one or more conductors 7. One or more conductors 7 are disposed in contact with two-dimensional material layer 1. One or more conductors 7 are in contact with a portion positioned on insulating film 3 in two-dimensional material layer 1. In this case, the life of optical carriers in two-dimensional material layer 1 is prolonged. As a result, the sensitivity of the electromagnetic wave detector can be increased.

Eleventh Embodiment

<Configuration of Electromagnetic Wave Detector>

Figure 30:
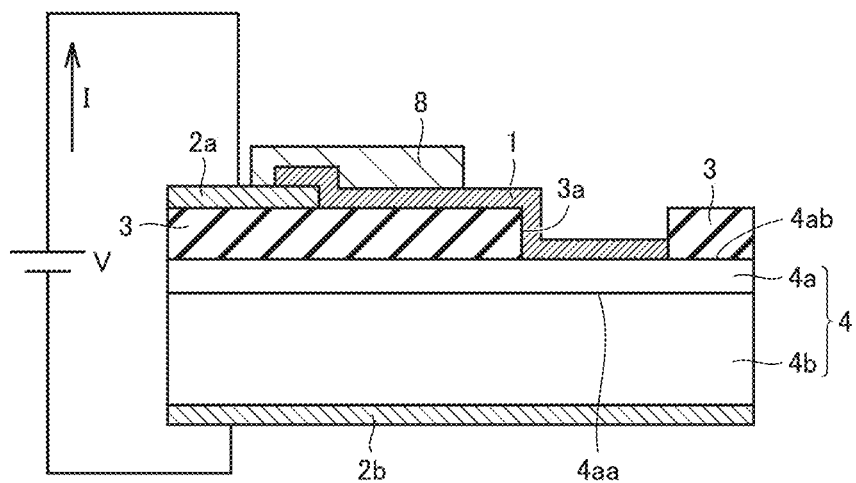
FIG. 30 is a cross-sectional view of the electromagnetic wave detector according to an eleventh embodiment.
Figure 31:
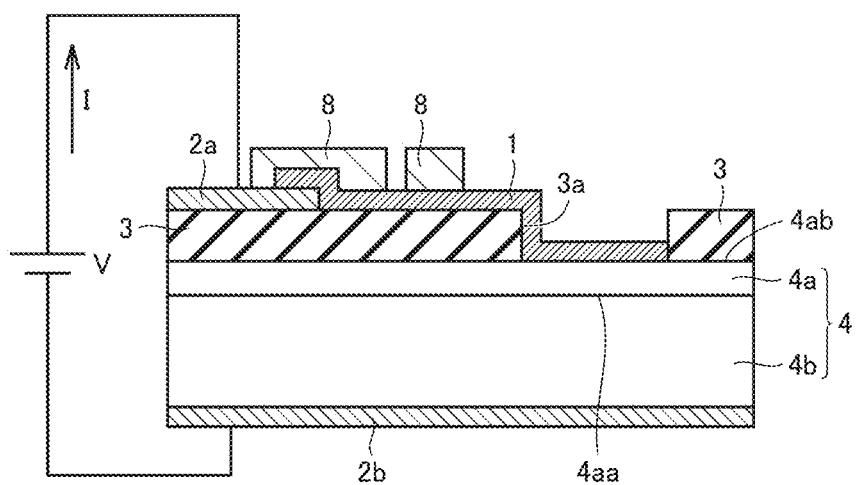
FIG. 31 is a cross-sectional view of a modification of the electromagnetic wave detector according to the eleventh embodiment.

FIG. 30 is a cross-sectional view of the electromagnetic wave detector according to an eleventh embodiment. FIG. 31 is a cross-sectional view of a modification of the electromagnetic wave detector according to the eleventh embodiment.

The electromagnetic wave detector shown in FIG. 30 basically has a configuration similar to the electromagnetic wave detector shown in FIG. 1 and FIG. 2 and can achieve a similar effect but differs from the electromagnetic wave detector shown in FIG. 1 and FIG. 2 in the configuration on two-dimensional material layer 1. More specifically, the electromagnetic wave detector shown in FIG. 30 differs from the electromagnetic wave detector shown in FIG. 1 and FIG. 2 in that at least one or more contact layers 8 are formed on the surface of the upper portion of two-dimensional material layer 1. This will be specifically described below.

In the electromagnetic wave detector shown in FIG. 30, contact layer 8 is provided on two-dimensional material layer 1. Contact layer 8 is formed of a material that is in contact with two-dimensional material layer 1 to supply holes or electrons to two-dimensional material layer 1. Contact layer 8 allows holes or electrons to be doped in two-dimensional material layer 1 if appropriate.

For example, a composition, called positive photoresist, containing a photosensitive agent having quinonediazide group and novolac resin can be used as contact layer 8. For example, a material having polar group can be used as the material forming contact layer 8. For example, a material having electron-withdrawing group as an example of the material has the effect of reducing the electron density of two-dimensional material layer 1. Furthermore, a material having electron-donating group as an example of the material has the effect of increasing the electron density of two-dimensional material layer 1. Examples of the material having electron-withdrawing group include materials having halogen, nitril, carboxyl group, and carbonyl group. Examples of the material having electron-donating group include materials having alkyl group, alcohol, amino group, and hydroxyl group. A material other than those described above that causes uneven distribution of charges in the entire molecule because of polar group can also be used as the material of contact layer 8.

In organic substances, metals, semiconductors, insulators, two-dimensional materials, or a mixture of any of these materials, any material that causes uneven distribution of charges in a molecule and produces polarity can be used a material of contact layer 8. Here, when contact layer 8 made of an inorganic substance is in contact with two-dimensional material layer 1, the conductivity type of doping of two-dimensional material layer 1 is the p type if the work function of contact layer 8 is larger than the work function of two-dimensional material layer 1, and is the n type if smaller. On the other hand, when contact layer 8 is an organic substance, the organic substance that is the material forming contact layer 8 does not have an explicit work function. Therefore, to determine n-type doping or p-type doping for two-dimensional material layer 1, it is preferable that the polarity group of the material of contact layer 8 is determined based on the polarity of the molecules of the organic substance used in contact layer 8.

For example, when a composition, called positive photoresist, containing a photosensitive agent having quinonediazide group and novolac resin is used as contact layer 8, a region where a resist is formed by photolithography in two-dimensional material layer 1 serves as a p-type two-dimensional material layer region. This process eliminates the need for a process of forming a mask in contact with a surface of two-dimensional material layer 1. As a result, process damage to two-dimensional material layer 1 can be reduced and the process can be simplified.

In the electromagnetic wave detector according to the present embodiment, contact layer 8 is formed on two-dimensional material layer 1. As described above, the state (conductivity type) of two-dimensional material layer 1 can be intentionally made into the n type or the p type, for example, by using a material having electron-withdrawing material group or a material having electron-donating group as the material of contact layer 8. In this case, carrier doping of two-dimensional material layer 1 can be controlled without considering the influence of carrier doping from first electrode part 2a and first semiconductor portion 4a. As a result, the performance of the electromagnetic wave detector can be enhanced.

Furthermore, contact layer 8 is formed on only one of the side closer to first electrode part 2a or the side closer to first semiconductor portion 4a in the surface of the upper portion of two-dimensional material layer 1, whereby a gradient of charge density is formed in two-dimensional material layer 1. As a result, the mobility of carriers in two-dimensional material layer 1 is enhanced, and higher sensitivity of the electromagnetic wave detector can be achieved.

The electromagnetic wave detector shown in FIG. 31 basically has a configuration similar to the electromagnetic wave detector shown in FIG. 30 and can achieve a similar effect but differs from the electromagnetic wave detector shown in FIG. 30 in that a plurality of contact layers 8 are formed on two-dimensional material layer 1. In the electromagnetic wave detector shown in FIG. 31, two contact layers 8 are formed on two-dimensional material layer 1. Three or more or any number of contact layers 8 may be formed. A plurality of contact layers 8 may be formed on two-dimensional material layer 1 positioned between first electrode part 2a and first semiconductor portion 4a. In this case, a plurality of contact layers 8 may be of the same material or of different materials.

Furthermore, in the electromagnetic wave detector according to the present embodiment, the film thickness of contact layer 8 is preferably thin enough to allow photoelectric inversion when two-dimensional material layer 1 is irradiated with electromagnetic waves. On the other hand, contact layer 8 is preferably formed to have a thickness to a degree that allows carriers to be doped from contact layer 8 into two-dimensional material layer 1. Contact layer 8 may have any configuration as long as molecules or carriers such as electrons are introduced into two-dimensional material layer 1. For example, two-dimensional material layer 1 may be doped with a carrier without forming solid contact layer 8 on two-dimensional material layer 1, by dipping two-dimensional material layer 1 in a solution to supply a carrier to two-dimensional material layer 1 in a molecular level.

Furthermore, a material that produces polarity inversion, other than the materials described above, may be used as a material of contact layer 8. In this case, when contact layer 8 has polarity converted, electrons or holes produced in inversion are supplied to two-dimensional material layer 1. Thus, doping of electrons or holes occurs in a portion of two-dimensional material layer 1 in contact with contact layer 8. Thus, even when contact layer 8 is removed, this portion of two-dimensional material layer 1 that has been in contact with contact layer 8 remains doped with electrons or holes. Therefore, when a material that produces polarity inversion is used as contact layer 8, contact layer 8 may be removed from two-dimensional material layer 1 after a certain time has passed. In this case, the area of the opening portion of two-dimensional material layer 1 is increased compared with when contact layer 8 is present. Thus, the detection sensitivity of the electromagnetic wave detector can be enhanced. As used herein polarity inversion is a phenomenon in which a polar group is chemically inverted and refers to a phenomenon, for example, in which an electron-withdrawing group changes to an electron-donating group, or a polar group changes to a nonpolar group, or a nonpolar group changes to a polar group.

Furthermore, contact layer 8 may be formed of a material that produces polarity inversion by electromagnetic wave radiation. In this case, a material that produces polarity inversion at particular wavelengths of electromagnetic waves is selected as a material of contact layer 8, so that polarity change occurs in contact layer 8 only at the time of radiation of electromagnetic waves having particular wavelengths, enabling doping of two-dimensional material layer 1. As a result, photocurrent flowing into two-dimensional material layer 1 can be increased.

Furthermore, a material that produces an oxidation reduction reaction by electromagnetic wave radiation may be used as a material of contact layer 8. In this case, two-dimensional material layer 1 can be doped with electrons or holes produced in an oxidation reduction reaction.

Here, the configuration of the electromagnetic wave detector according to the present embodiment can be applied to other embodiments.

<Operation Effect>

The electromagnetic wave detector described above includes contact layer 8 in contact with two-dimensional material layer 1. Contact layer 8 supplies holes or electrons to two-dimensional material layer 1. In this case, carrier doping of two-dimensional material layer 1 can be controlled without considering the influence of carrier doping from first electrode part 2a and first semiconductor portion 4a. As a result, the performance of the electromagnetic wave detector can be enhanced.

Twelfth Embodiment

<Configuration of Electromagnetic Wave Detector>

Figure 32:
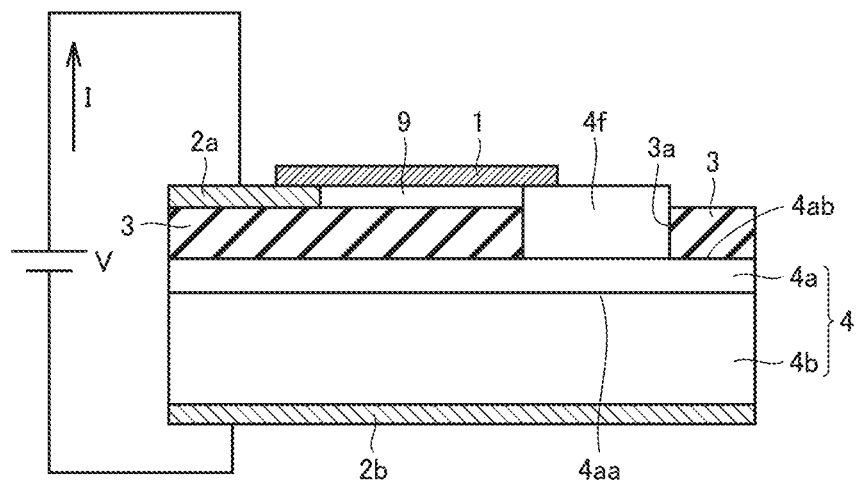
FIG. 32 is a cross-sectional view of the electromagnetic wave detector according to a twelfth embodiment.

FIG. 32 is a cross-sectional view of the electromagnetic wave detector according to a twelfth embodiment. The electromagnetic wave detector shown in FIG. 32 basically has a configuration similar to the electromagnetic wave detector shown in FIG. 1 and FIG. 2 and can achieve a similar effect but differs from the electromagnetic wave detector shown in FIG. 1 and FIG. 2 in structure of two-dimensional material layer 1. More specifically, in the electromagnetic wave detector shown in FIG. 32, a gap 9 is formed between insulating film 3 and two-dimensional material layer 1.

As shown in FIG. 32, gap 9 is formed between two-dimensional material layer 1 and insulating film 3. More specifically, unlike the electromagnetic wave detector according to the first embodiment, the portion corresponding to the channel region in two-dimensional material layer 1 is not in contact with insulating film 3. In this case, a semiconductor portion 4f may be formed on first semiconductor portion 4a in opening portion 3a. The material forming semiconductor portion 4f may be the same as the material forming first semiconductor portion 4a. The surface of the upper portion of semiconductor portion 4f is preferably flush with the surface of the upper portion of first electrode part 2a. Two-dimensional material layer 1 extends from on first electrode part 2a onto semiconductor portion 4f. Gap 9 positioned under two-dimensional material layer 1 is positioned between first electrode part 2a and opening portion 3a. Any other configuration may be employed as long as gap 9 is provided between insulating film 3 and two-dimensional material layer 1.

Here, the configuration of the electromagnetic wave detector according to the present embodiment can be applied to other embodiments.

<Operation Effect>

In the electromagnetic wave detector described above, gap 9 is formed between insulating film 3 and two-dimensional material layer 1. In this case, the influence of scattering of carriers due to the contact between insulating film 3 and two-dimensional material layer 1 can be eliminated. As a result, reduction in mobility of carriers in two-dimensional material layer 1 can be suppressed. As a result, the sensitivity of the electromagnetic wave detector can be enhanced. The optical gate effect can be exerted even when there is gap 9 below two-dimensional material layer 1.

Thirteenth Embodiment

<Configuration of Electromagnetic Wave Detector>

Figure 33:
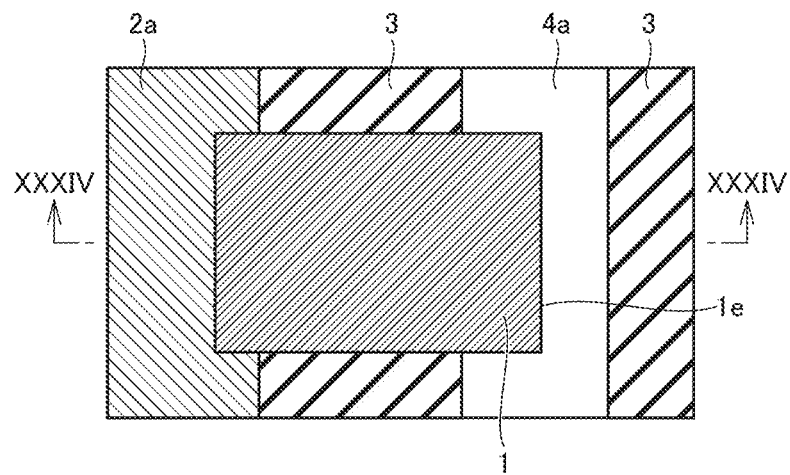
FIG. 33 is a plan view of the electromagnetic wave detector according to a thirteenth embodiment.
Figure 34:
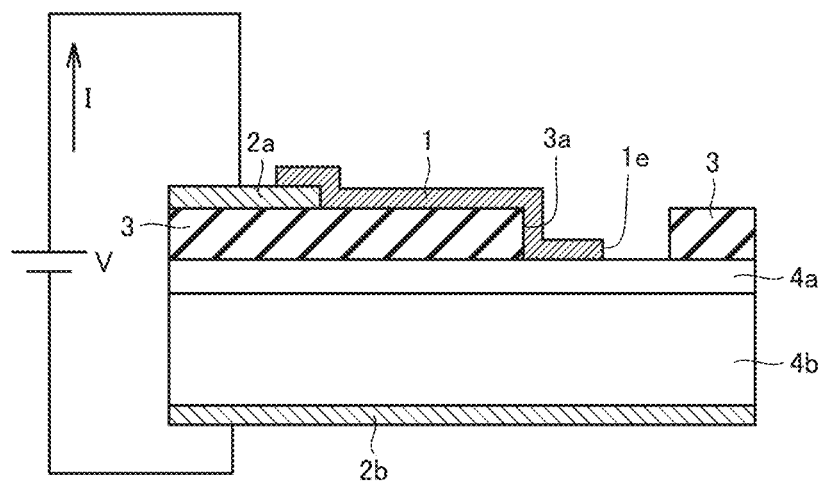
FIG. 34 is a cross-sectional view along line XXXIV-XXXIV in FIG. 33.
Figure 35:
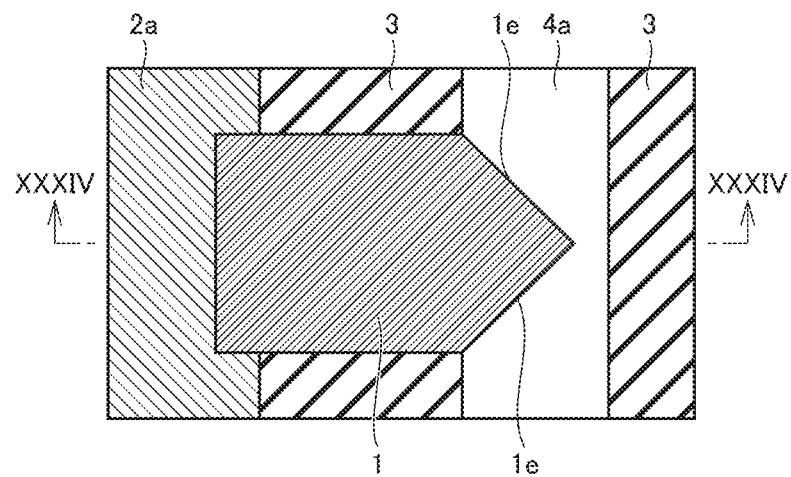
FIG. 35 is a plan view of a first modification of the electromagnetic wave detector according to the thirteenth embodiment.
Figure 36:
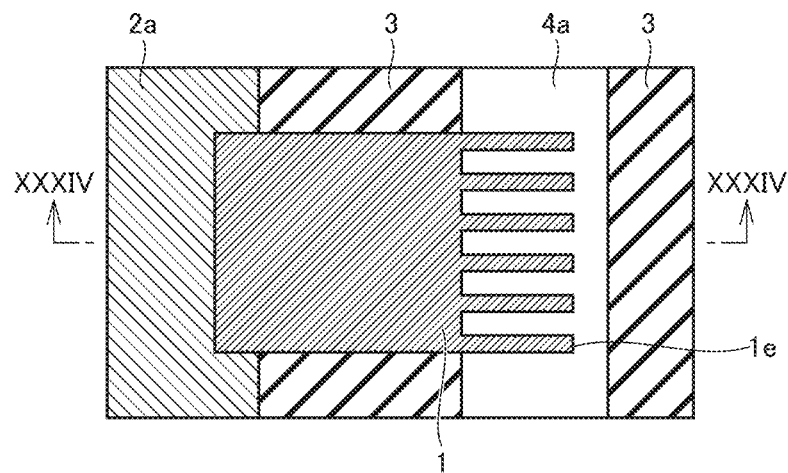
FIG. 36 is a plan view of a second modification of the electromagnetic wave detector according to the thirteenth embodiment.
Figure 37:
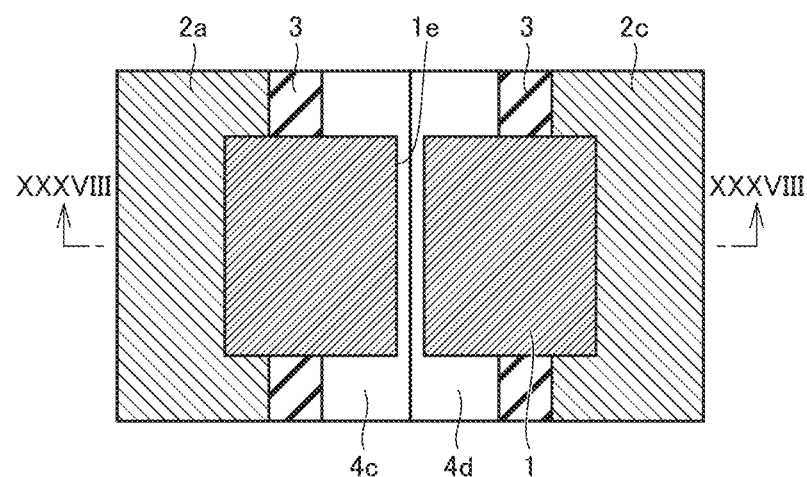
FIG. 37 is a plan view of a third modification of the electromagnetic wave detector according to the thirteenth embodiment.
Figure 38:
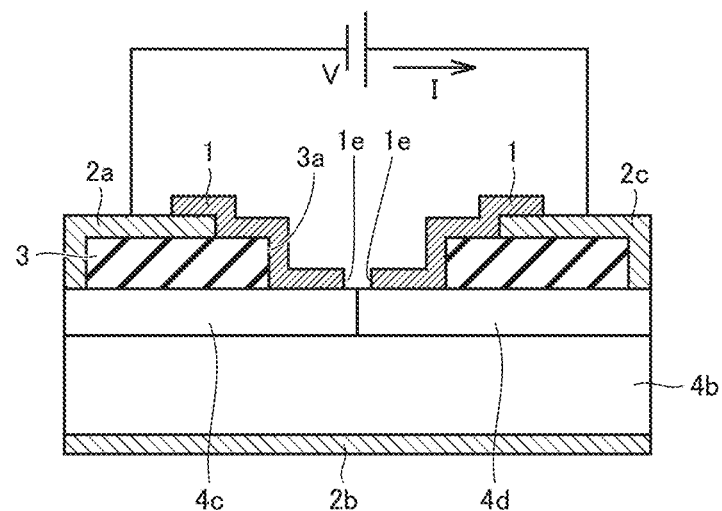
FIG. 38 is a cross-sectional view along line XXXVIII-XXXVIII in FIG. 37.
Figure 39:
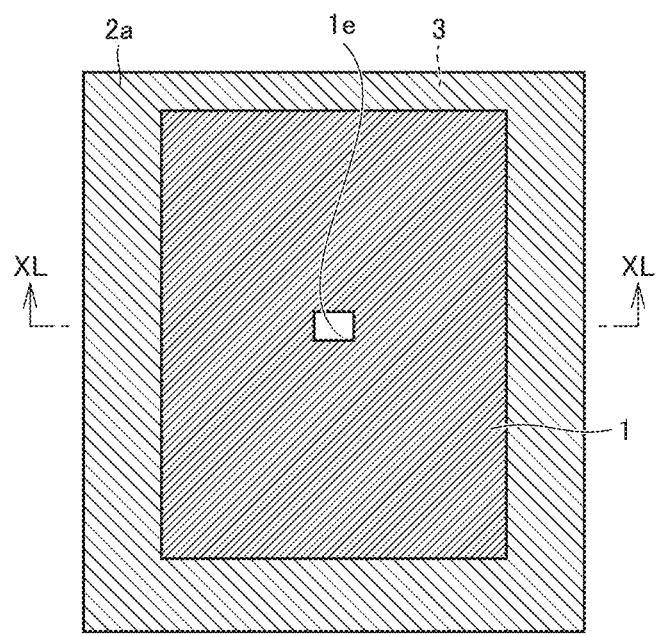
FIG. 39 is a plan view of a fourth modification of the electromagnetic wave detector according to the thirteenth embodiment.
Figure 40:
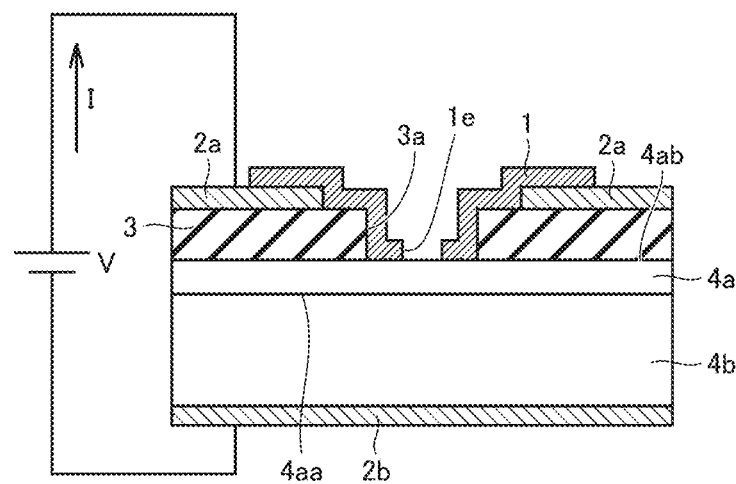
FIG. 40 is a cross-sectional view along line XL-XL in FIG. 39.
Figure 41:
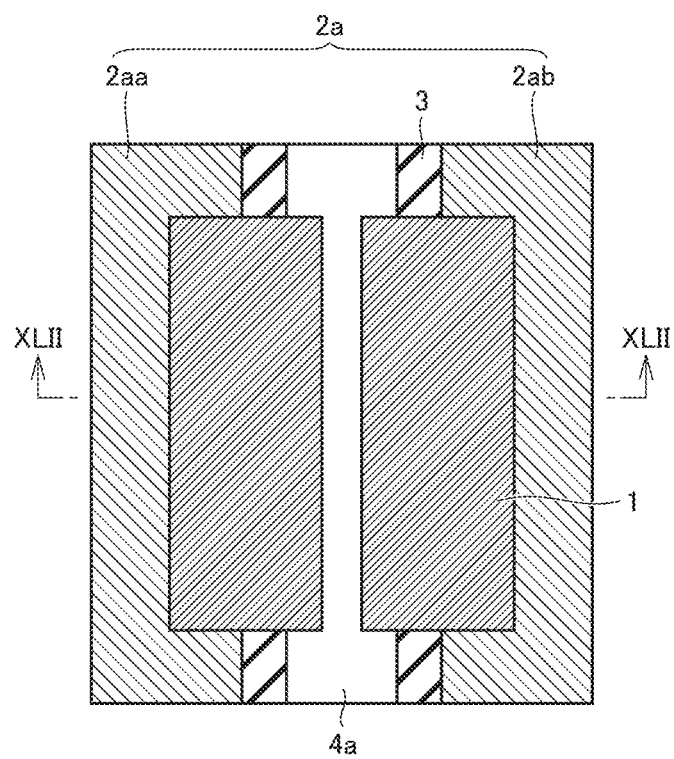
FIG. 41 is a plan view of a fifth modification of the electromagnetic wave detector according to the thirteenth embodiment.
Figure 42:
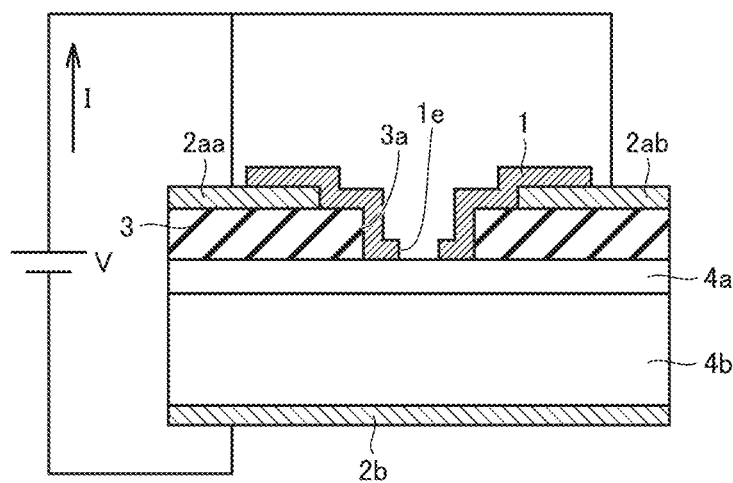
FIG. 42 is a cross-sectional view along line XLII-XLII in FIG. 41.

FIG. 33 is a plan view of the electromagnetic wave detector according to a thirteenth embodiment. FIG. 34 is a cross-sectional view along line XXXIV-XXXIV in FIG. 33. FIG. 35 is a plan view of a first modification of the electromagnetic wave detector according to the thirteenth embodiment. FIG. 36 is a plan view of a second modification of the electromagnetic wave detector according to the thirteenth embodiment. FIG. 37 is a plan view of a third modification of the electromagnetic wave detector according to the thirteenth embodiment. FIG. 38 is a cross-sectional view along line XXXVIII-XXXVIII in FIG. 37. FIG. 39 is a plan view of a fourth modification of the electromagnetic wave detector according to the thirteenth embodiment. FIG. 40 is a cross-sectional view along line XL-XL in FIG. 39. FIG. 41 is a plan view of a fifth modification of the electromagnetic wave detector according to the thirteenth embodiment. FIG. 42 is a cross-sectional view along line XLII-XLII in FIG. 41.

The electromagnetic wave detector shown in FIG. 33 to FIG. 34 basically has a configuration similar to the electromagnetic wave detector shown in FIG. 1 and FIG. 2 and can achieve a similar effect but differs from the electromagnetic wave detector shown in FIG. 1 and FIG. 2 in configuration of two-dimensional material layer 1. More specifically, in the electromagnetic wave detector shown in FIG. 33 to FIG. 34, at least one end portion 1e of two-dimensional material layer 1 is disposed inside (excluding the edge portion) of opening portion 3a of insulating film 3, and end portion 1e is connected to first semiconductor portion 4a. In this respect, the electromagnetic wave detector in FIG. 33 to FIG. 34 differs from the electromagnetic wave detector in FIG. 1 and FIG. 2 in which the end portion 1e is in contact with the edge portion of opening portion 3a. Specifically, end portion 1e on the side opposite to region 1a at the end portion of two-dimensional material layer 1 is disposed in a region inside of the edge portion that is the inner wall of opening portion 3a. End portion 1e is therefore disposed so as not to be in contact with the inner wall in opening portion 3a.

The electromagnetic wave detector shown in FIG. 35 basically has a configuration similar to the electromagnetic wave detector shown in FIG. 33 to FIG. 34 and can achieve a similar effect but differs from the electromagnetic wave detector shown in FIG. 33 to FIG. 34 in configuration of two-dimensional material layer 1. More specifically, in the electromagnetic wave detector shown in FIG. 35, at least one end portion 1e on the side opposite to region 1a at the end portion of two-dimensional material layer 1 has a triangular shape. Two-dimensional material layer 1 has a triangular shape inside opening portion 3a.

The electromagnetic wave detector shown in FIG. 36 basically has a configuration similar to the electromagnetic wave detector shown in FIG. 33 to FIG. 34 and can achieve a similar effect but differs from the electromagnetic wave detector shown in FIG. 33 to FIG. 34 in configuration of two-dimensional material layer 1. More specifically, in the electromagnetic wave detector shown in FIG. 36, at least one end portion 1e on the side opposite to region 1a at the end portion of two-dimensional material layer 1 has a comb shape. In two-dimensional material layer 1, regions of portion 1e extending rightward and regions not extending appear alternately with respect to the top-bottom direction in the drawing, inside opening portion 3a. As a result, two-dimensional material layer 1 has a comb-like shape in which thin teeth are spaced apart from each other with respect to the top-bottom direction of the drawing, inside opening portion 3a. Two-dimensional material layer 1 may have such a shape. The length and the number of comb teeth are not limited, but the length of end portion 1e is preferably longer.

The electromagnetic wave detector shown in FIG. 37 and FIG. 38 basically has a configuration similar to the electromagnetic wave detector shown in FIG. 33 to FIG. 34 and can achieve a similar effect but differs from the electromagnetic wave detector shown in FIG. 33 to FIG. 34 in configuration of two-dimensional material layer 1, first electrode part 2a, insulating film 3, and light-receiving element 4. More specifically, the configuration of first electrode part 2a, insulating film 3, and light-receiving element 4 is similar to that in FIG. 12. Two-dimensional material layer 1 is partitioned on third semiconductor portion 4c and fourth semiconductor portion 4d and divided into two. Two-dimensional material layer 1 is not disposed between one and the other of two-dimensional material layer 1 divided into two, and third semiconductor portion 4c and fourth semiconductor portion 4d are exposed. At least one end portion 1e of one of two-dimensional material layer 1 divided into two is disposed on third semiconductor portion 4c inside opening portion 3a. At least one end portion 1e of the other of two-dimensional material layer 1 divided into two is disposed on fourth semiconductor portion 4d inside opening portion 3a. These two end portions 1e are opposed to each other.

The electromagnetic wave detector shown in FIG. 39 and FIG. 40 basically has a configuration similar to the electromagnetic wave detector shown in FIG. 33 to FIG. 34 and can achieve a similar effect but differs from the electromagnetic wave detector shown in FIG. 33 to FIG. 34 in configuration of two-dimensional material layer 1, first electrode part 2a, and insulating film 3. More specifically, the configuration of first electrode part 2a, insulating film 3, and light-receiving element 4 is similar to that in FIG. 22 to FIG. 23. Two-dimensional material layer 1 has a rectangular opening in the inside of opening portion 3a. This opening is formed as a region in which first semiconductor portion 4a inside opening portion 3a is not covered with two-dimensional material layer 1 but is exposed. Among four sides of this opening, for example, two sides on the left side and the right side in FIG. 40 as viewed from the center of opening portion 3a are formed as end portions 1e of two-dimensional material layer 1.

The electromagnetic wave detector shown in FIG. 41 and FIG. 42 basically has a configuration similar to the electromagnetic wave detector shown in FIG. 33 to FIG. 34 and can achieve a similar effect but differs from the electromagnetic wave detector shown in FIG. 33 to FIG. 34 in configuration of two-dimensional material layer 1, first electrode part 2a, and insulating film 3. More specifically, the configuration of first electrode part 2a, insulating film 3, and light-receiving element 4 is similar to that in FIG. 24 to FIG. 25. Two-dimensional material layer 1 is partitioned on first semiconductor portion 4a and divided into two. Two-dimensional material layer 1 is not disposed between one and the other of two-dimensional material layer 1 divided into two, and first semiconductor portion 4a is exposed. At least one end portion 1e of one of two-dimensional material layer 1 divided into two and at least one end portion 1e of the other of two-dimensional material layer 1 divided into two are opposed to each other. In this way, in FIG. 41 and FIG. 42, a plurality of two-dimensional material layers 1 are disposed in the inside of opening portion 3a of insulating film 3.

In the examples of the present embodiment described above, end portion 1e of two-dimensional material layer 1 may be graphene nanoribbons. Graphene nanoribbons have a bandgap. Thus, a Schottky barrier is formed at a junction region between graphene nanoribbons and first semiconductor portion 4a. This configuration can reduce dark current in the electromagnetic wave detector and enhance the sensitivity of the electromagnetic wave detector.

Here, the configuration of the electromagnetic wave detector according to the present embodiment can be applied to other embodiments.

<Operation Effect>

In the electromagnetic wave detector described above, at least one end portion 1e of two-dimensional material layer 1 may be disposed in the inside excluding the edge portion of opening portion 3a of insulating film 3. The semiconductor portion of light-receiving element 4 is exposed in the inside of opening portion 3a. In the region adjacent to end portion 1e, therefore, a Schottky barrier is formed in the junction region between two-dimensional material layer 1 and the semiconductor portion of light-receiving element 4. Thus, when two-dimensional material layer 1 and the semiconductor portion operate in reverse bias in the junction region, dark current in the electromagnetic wave detector can be reduced, and the sensitivity of the electromagnetic wave detector can be enhanced. Furthermore, when two-dimensional material layer 1 and the semiconductor portion operate in forward bias, photocurrent to be extracted is amplified, and the sensitivity of the electromagnetic wave detector can be enhanced.

Fourteenth Embodiment

Figure 43:
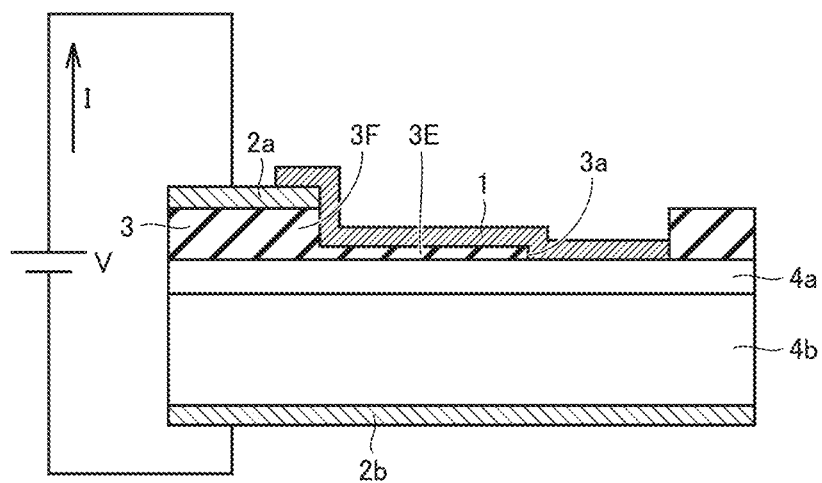
FIG. 43 is a cross-sectional view of the electromagnetic wave detector according to a fourteenth embodiment.

FIG. 43 is a cross-sectional view of the electromagnetic wave detector according to a fourteenth embodiment. The electromagnetic wave detector shown in FIG. 43 basically has a configuration similar to the electromagnetic wave detector shown in FIG. 1 and FIG. 2 and can achieve a similar effect but differs from the electromagnetic wave detector shown in FIG. 1 and FIG. 2 in configuration of insulating film 3. More specifically, in the electromagnetic wave detector shown in FIG. 43, insulating film 3 has a step. Specifically, insulating film 3 differs from that of the electromagnetic wave detector shown in FIG. 1 and FIG. 2 in that the thickness of a first region 3E between opening portion 3a and first electrode part 2a is smaller than the thickness of a second region 3F other than the first region 3E.

As shown in FIG. 43, the boundary between first region 3E and second region 3F is formed at an end potion of first electrode part 2a on the side closer to opening portion 3a. Insulating film 3 has a step at the boundary and has different thicknesses through the step. It is preferable that insulating film 3 in first region 3E is as thin as possible to the extent that tunnel current is not produced. Insulating film 3 can be formed by any method. For example, after insulating film 3 is formed, only insulating film 3 in first region 3E may be thinned by a well-known etching process. Alternatively, only insulating film 3 in first region 3E may be formed of another insulating film 3 different from insulating film 3, for example, by atomic layer deposition (ALD). Another insulating film 3 may be of the same material as insulating film 3 in second region 3F or may be of a material different from the insulating film in second region 3F.

<Operation Effect>

In the electromagnetic wave detector described above, as shown in FIG. 43, the thickness of insulating film 3 in first region 3E between opening portion 3a and first electrode part 2a may be smaller than the thickness in second region 3F other than first region 3E. When insulating film 3 in first region 3E is thinner than insulating film 3 in second region 3F, the degree of electric field change in two-dimensional material layer 1 increases. That is, the pn junction in light-receiving element 4 including first semiconductor portion 4a and second semiconductor portion 4b is irradiated with electromagnetic waves to apply electric field change to two-dimensional material layer 1. In this case, if insulating film 3 in first region 3E is thinner than insulating film 3 in second region 3F, the degree of electric field change is increased. Thus, photocurrent flowing through two-dimensional material layer 1 increases, and higher sensitivity of the electromagnetic wave detector can be achieved.

Fifteenth Embodiment

<Configuration of Electromagnetic Wave Detector>

Figure 44:
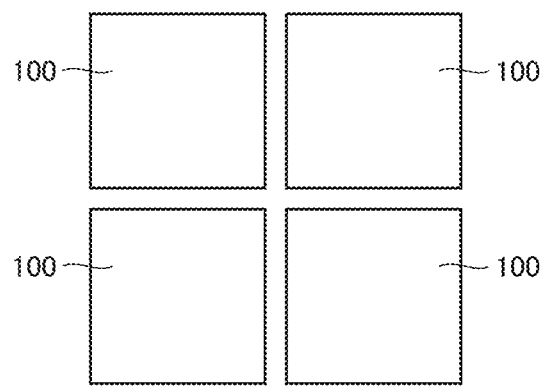
FIG. 44 is a plan view of the electromagnetic wave detector according to a fifteenth embodiment.
Figure 45:
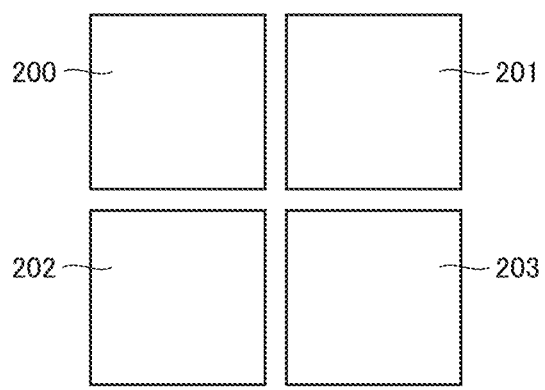
FIG. 45 is a plan view of a modification of the electromagnetic wave detector according to the fifteenth embodiment.

FIG. 44 is a plan view of the electromagnetic wave detector according to a fifteenth embodiment. FIG. 45 is a plan view of a modification of the electromagnetic wave detector according to the fifteenth embodiment.

The electromagnetic wave detector shown in FIG. 44 is an electromagnetic wave detector assembly and includes a plurality of electromagnetic wave detectors 100 according to any one of the first to fourteenth embodiments as detection elements. For example, the electromagnetic wave detector according to the first embodiment may be used as electromagnetic wave detector 100. In FIG. 44, electromagnetic wave detectors 100 are disposed in an array in two-dimensional directions. A plurality of electromagnetic wave detectors 100 may be disposed side by side in one-dimensional direction. This will be specifically described below.

As shown in FIG. 44, in the electromagnetic wave detector according to the present embodiment, electromagnetic wave detectors 100 are disposed in a 2×2 array. However, the number of electromagnetic wave detectors 100 disposed is not limited to this. For example, a plurality of electromagnetic wave detectors 100 may be disposed in a 3 or more ×3 or more array. Furthermore, in the present embodiment, a plurality of electromagnetic wave detectors 100 are disposed periodically in two dimensions. However, a plurality of electromagnetic wave detectors 100 may be disposed periodically along a certain direction. Furthermore, a plurality of electromagnetic wave detectors 100 are not necessarily disposed periodically but may be disposed at different intervals.

When a plurality of electromagnetic wave detectors 100 are disposed in an array, second electrode part 2b may be a common electrode as long as electromagnetic wave detectors 100 are isolated from each other. When second electrode part 2b is a common electrode, the pixels require less wiring than when second electrode part 2b is independent in each electromagnetic wave detector 100. As a result, a higher resolution of the electromagnetic wave detector assembly can be achieved.

As a method of isolating electromagnetic wave detectors 100 from each other, for example, current cut-off mechanism 5 such as a trench structure described in the second embodiment may be provided on the outer periphery of electromagnetic wave detector 100.

In this way, the electromagnetic wave detector assembly including a plurality of electromagnetic wave detectors 100 can be used as an image sensor, in which a plurality of electromagnetic wave detectors 100 are disposed in an array.

Here, in the present embodiment, the electromagnetic wave detector assembly including a plurality of electromagnetic wave detectors 100 according to the first embodiment has been described. However, instead of the electromagnetic wave detectors according to the first embodiment, the electromagnetic wave detectors according to other embodiments may be used.

The electromagnetic wave detector shown in FIG. 45 is an electromagnetic wave detector assembly and basically has a configuration similar to the electromagnetic wave detector shown in FIG. 44 and can achieve a similar effect but differs from the electromagnetic wave detector shown in FIG. 44 in that it includes different kinds of electromagnetic wave detectors 200, 201, 202, and 203 as a plurality of electromagnetic wave detectors. More specifically, in the electromagnetic wave detector shown in FIG. 45, different kinds of electromagnetic wave detectors 200, 201, 202, and 203 are disposed in an array (in a matrix).

In FIG. 45, electromagnetic wave detectors 200, 201, 202, and 203 are disposed in a 2×2 matrix. However, the number of electromagnetic wave detectors disposed is not limited to this. Furthermore, in the present embodiment, different kinds of electromagnetic wave detectors 200, 201, 202, and 203 are arranged periodically in two dimensions but may be arranged periodically in one dimension. Furthermore, different kinds of electromagnetic wave detectors 200, 201, 202, and 203 may be disposed at different intervals rather than periodically.

In the electromagnetic wave detector assembly shown in FIG. 45, different kinds of electromagnetic wave detectors 200, 201, 202, and 203 according to any of the first to twelfth embodiments are disposed in a one-dimensional or two-dimensional array to exhibit the function as an image sensor. For example, electromagnetic wave detectors having different detection wavelengths may be used as electromagnetic wave detectors 200, 201, 202, and 203. Specifically, electromagnetic wave detectors having different detection wavelength selectivity may be prepared from among the electromagnetic wave detectors according to any of the first to twelfth embodiments and arranged in an array. In this case, the electromagnetic wave detector assembly can detect electromagnetic waves having two or more different wavelengths.

In this way, electromagnetic wave detectors 200, 201, 202, and 203 having different detection wavelengths are disposed in an array, so that the wavelengths of electromagnetic waves in a desired wavelength band, such as a wavelength band of ultraviolet light, infrared light, and terahertz waves, and radio waves, can be identified, in the same manner as an image sensor for use in the visible light range. As a result, for example, a color image that represents wavelength differences as color differences can be obtained.

Furthermore, semiconductor materials having different detection wavelengths may be used as constituent materials of light-receiving elements 4 included in the electromagnetic wave detectors. For example, a semiconductor material having detection wavelengths of visible light and a semiconductor material having detection wavelengths of infrared rays may be used as the constituent materials. In this case, for example, when the electromagnetic wave detector is applied to an on-vehicle sensor, the electromagnetic wave detector can be used as a camera for visible light images during daytime. Further, the electromagnetic wave detector can also be used as an infrared camera during nighttime. In this way, there is no need for using different cameras having an image sensor depending on detection wavelengths of electromagnetic waves.

As an application of the electromagnetic wave detector other than image sensors, for example, the electromagnetic wave detector can be used as a position detecting sensor capable of detecting the position of an object even with a small number of pixels. For example, the structure of the electromagnetic wave detector assembly including electromagnetic wave detectors 200, 201, 202, and 203 having different detection wavelengths as described above can provide an image sensor detecting the intensities of electromagnetic waves of a plurality of wavelengths. This configuration can detect electromagnetic waves of a plurality of wavelengths and provide a color image, without using a color filter that is conventionally necessary in a CMOS image sensor or the like.

Further, electromagnetic wave detectors 200, 201, 202, and 203 detecting different polarized lights can be arranged in an array to form a polarization identifying image sensor. For example, four pixels whose detection polarization angles are 0°, 90°, 45°, and 135° make one unit, and a plurality of units of electromagnetic wave detectors are disposed to enable polarization imaging. The polarization identifying image sensor enables, for example, identification of artificial objects and natural objects, material identification, identification of objects at the same temperature in the infrared wavelength band, identification of a boundary between objects, or equivalent resolution enhancement.

As described above, the electromagnetic wave detector assembly according to the present embodiment configured as described above can detect electromagnetic waves in a wide wavelength range. Furthermore, the electromagnetic wave detector assembly according to the present embodiment can detect electromagnetic waves having different wavelengths.

<Operation Effect>

The electromagnetic wave detector assembly described above includes a plurality of electromagnetic wave detectors. Electromagnetic wave detectors 200, 201, 202, and 203 may be electromagnetic wave detectors of different kinds. For example, electromagnetic wave detectors 200, 201, 202, and 203 may have different detection wavelengths. In this case, electromagnetic waves having different wavelengths can be detected by a single electromagnetic wave detector assembly.

In the foregoing embodiments, it is preferable that a material that has characteristics changed by radiation of electromagnetic waves and applies potential change to two-dimensional material layer 1 is used as a material of insulating film 3, or contact layer 8 shown in FIG. 30 and FIG. 31, or first to fifth semiconductor portions 4a to 4e and semiconductor portion 4f.

Here, examples of the material that has characteristics changed by radiation of electromagnetic waves and applies potential change to two-dimensional material layer 1 include quantum dots, ferroelectric materials, liquid crystal materials, fullerene, rare earth oxides, semiconductor materials, pn junction materials, metal-semiconductor junction materials, and metal-insulator-semiconductor junction materials. For example, when a ferroelectric material having the polarization effect (pyroelectric effect) by electromagnetic waves is used as the ferroelectric material, radiation of electromagnetic waves causes polarization change in the ferroelectric material. As a result, potential change can be applied to two-dimensional material layer 1.

As described above, when the material as described above is used as the material of insulating film 3, the characteristics are changed by radiation of electromagnetic waves in insulating film 3 or contact layer 8 or first to fifth semiconductor portions 4a to 4e and semiconductor portion 4f. As a result, potential change can be applied to two-dimensional material layer 1.

An example in which the material that has characteristics changed by radiation of electromagnetic waves and applies potential change to two-dimensional material layer 1 is applied to insulating film 3 or contact layer 8 or first to fifth semiconductor portions 4a to 4e and semiconductor portion 4f has been described. However, it is only necessary that the material that has characteristics changed by radiation of electromagnetic waves and applies potential change to two-dimensional material layer 1 is applied to at least one or more of the members described above. For example, the material that has characteristics changed by radiation of electromagnetic waves and applies potential change to two-dimensional material layer 1 is applied to contact layer 8, contact layer 8 need not be in direct contact with two-dimensional material layer 1. For example, contact layer 8 may be provided on the upper surface or the lower surface of two-dimensional material layer 1 with an insulating film or the like interposed as long as it can apply potential change to two-dimensional material layer 1.

The foregoing embodiments are susceptible to modifications and elimination if necessary. Further, the foregoing embodiments can be modified in various ways without departing from the spirit in the practical phase. The foregoing embodiments include disclosure in various stages and various disclosures can be extracted with an appropriate combination of the disclosed constituent elements.

Embodiments disclosed here should be understood as being illustrative rather than being limitative in all respects. At least two of the embodiments disclosed here can be combined in a consistent manner. The scope of the present disclosure is shown not in the foregoing description but in the claims, and it is intended that all modifications that come within the meaning and range of equivalence to the claims are embraced here.

REFERENCE SIGNS LIST 1 two-dimensional material layer, 1a, 1b, 1c region, 1d turbostratic structure portion, 2a first electrode part, 2aa first electrode, 2ab second electrode, 2b second electrode part, 2c electrode part, 2d connection conductor, 3 insulating film, 3a, 3c opening portion, 3aa first opening, 3ab second opening, 3b tapered portion, 3E first region, 3F second region, 4 light-receiving element, 4a first semiconductor portion, 4aa, 4ca junction portion, 4ab front surface, 4b second semiconductor portion, 4c third semiconductor portion, 4d fourth semiconductor portion, 4e fifth semiconductor portion, 4f semiconductor portion, 5 current cut-off mechanism, 6 buffer layer, 7 conductor, 8 contact layer, 9 gap, 100, 200, 201, 202, 203 electromagnetic wave detector.

The invention claimed is:

1. An electromagnetic wave detector comprising:
a light-receiving element including a first semiconductor portion of a first conductivity type and a second semiconductor portion of a second conductivity type, the second semiconductor portion being joined to the first semiconductor portion;
an insulating film disposed on the first semiconductor portion of the light-receiving element and having an opening portion;
a two-dimensional material layer electrically connected to the first semiconductor portion in the opening portion and extending from on the opening portion onto the insulating film;
a first electrode part disposed on the insulating film and electrically connected to the two-dimensional material layer; and
a second electrode part electrically connected to the second semiconductor portion, wherein
the two-dimensional material layer includes:
a region electrically connected, in the opening portion, to the light-receiving element; and
a region connected, between the first electrode part and the opening portion, to the light-receiving element through the insulating film, and producing an optical gate effect.

2. The electromagnetic wave detector according to claim 1, wherein
in the two-dimensional material layer, the region electrically connected, in the opening portion, to the light-receiving element is directly connected to the light-receiving element.

3. The electromagnetic wave detector according to claim 1, further comprising a buffer layer disposed between the two-dimensional material layer and the light-receiving element in an inside of the opening portion, wherein
in the two-dimensional material layer, the region electrically connected, in the opening portion, to the light-receiving element is connected to the light-receiving element through the buffer layer.

4. The electromagnetic wave detector according to claim 3, wherein the buffer layer has a thickness that allows tunnel current to be formed between the two-dimensional material layer and the light-receiving element.

5. The electromagnetic wave detector according to claim 1, further comprising a connection conductor electrically connecting the light-receiving element and the two-dimensional material layer in an inside of the opening portion, wherein
in the two-dimensional material layer, the region electrically connected, in the opening portion, to the light-receiving element is connected to the light-receiving element through the connection conductor.

6. The electromagnetic wave detector according to claim 1, wherein
the first semiconductor portion is electrically connected to the two-dimensional material layer in the opening portion.

7. The electromagnetic wave detector according to claim 1, wherein
the first semiconductor portion is disposed on the second semiconductor portion, and
the second electrode part is provided on a side opposite to a side having the first semiconductor portion in the second semiconductor portion and is electrically connected to the second semiconductor portion.

8. The electromagnetic wave detector according to claim 1, wherein the light-receiving element includes a current cut-off structure positioned in a region opposed to the insulating film and surrounding an outer periphery of the opening portion.

9. The electromagnetic wave detector according to claim 1, wherein
the light-receiving element includes
a third semiconductor portion having the first conductivity type and serving as the first semiconductor portion, and
a fourth semiconductor portion joined to the third semiconductor portion, having the second conductivity type, and serving as a part of the second semiconductor portion, and
at a bottom of the opening portion, a part of a junction portion between the third semiconductor portion and the fourth semiconductor portion, and a part of the third semiconductor portion and a part of the fourth semiconductor portion continuous to the junction portion face the two-dimensional material layer.

10. The electromagnetic wave detector according to claim 1, wherein the light-receiving element is a photodiode.

11. The electromagnetic wave detector according to claim 1, wherein
the insulating film is formed on a surface positioned on a side opposite to a junction portion joined to the second semiconductor portion in the first semiconductor portion, and
the light-receiving element further includes a fifth semiconductor portion having the second conductivity type, the fifth semiconductor portion penetrating from the surface of the first semiconductor portion to a surface on a side closer to the second semiconductor portion, at a bottom of the opening portion.

12. The electromagnetic wave detector according to claim 1, wherein the opening portion includes a first opening formed in the insulating film and a second opening formed at a position different from the first opening.

13. The electromagnetic wave detector according to claim 12, wherein
the light-receiving element has a quadrangular planar shape, and
in a planar view of the light-receiving element, the opening portion and the first electrode part are each disposed at a corner in the planar shape of the light-receiving element.

14. The electromagnetic wave detector according to claim 1, wherein the first electrode part includes a first electrode disposed on the insulating film and a second electrode disposed at a position different from the first electrode.

15. The electromagnetic wave detector according to claim 1, wherein the first semiconductor portion and the second semiconductor portion have different absorption wavelengths.

16. The electromagnetic wave detector according to claim 1, wherein the insulating film has a tapered portion having a thickness varying from the opening portion toward the first electrode part.

17. The electromagnetic wave detector according to claim 1, wherein the two-dimensional material layer includes a turbostratic structure portion.

18. The electromagnetic wave detector according to claim 1, further comprising one or more conductors or contact layers in contact with the two-dimensional material layer.

19. The electromagnetic wave detector according to claim 1, wherein a gap is formed between the insulating film and the two-dimensional material layer.

20. The electromagnetic wave detector according to claim 1, wherein at least one end portion of the two-dimensional material layer is disposed in an inside of the opening portion of the insulating film and electrically connected to the first semiconductor portion.

21. The electromagnetic wave detector according to claim 20, wherein the at least one end portion of the two-dimensional material layer has a comb shape.

22. The electromagnetic wave detector according to claim 1, wherein a thickness of the insulating film in a first region between the opening portion and the first electrode part is smaller than a thickness in a second region other than the first region.

23. The electromagnetic wave detector according to claim 1, wherein the two-dimensional material layer contains a material selected from the group consisting of graphene, transition metal dichalcogenide, black phosphorus, silicene, graphene nanoribbon, and borophene.

* * * * *